US008089308B2

(12) United States Patent
Yoshizawa et al.

(10) Patent No.: US 8,089,308 B2
(45) Date of Patent: Jan. 3, 2012

(54) PHASE CONTROLLING APPARATUS, PHASE-CONTROL PRINTED BOARD, AND CONTROLLING METHOD

(75) Inventors: Yoshiharu Yoshizawa, Kawasaki (JP); Yoshito Koyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 107 days.

(21) Appl. No.: 12/421,968

(22) Filed: Apr. 10, 2009

(65) Prior Publication Data
US 2009/0256605 A1    Oct. 15, 2009

(30) Foreign Application Priority Data

Apr. 11, 2008 (JP) ................................. 2008-104051
Mar. 19, 2009 (JP) ................................. 2009-069107

(51) Int. Cl.
*H03L 7/06* (2006.01)
(52) U.S. Cl. ....................... 327/158; 327/149
(58) Field of Classification Search .................. 327/149, 327/158
See application file for complete search history.

(56) References Cited

U.S. PATENT DOCUMENTS

| 6,028,816 | A | 2/2000 | Takemae et al. |
| 6,104,225 | A | 8/2000 | Taguchi et al. |
| 6,151,274 | A | 11/2000 | Takemae et al. |
| 6,225,841 | B1 | 5/2001 | Taguchi et al. |
| 6,333,660 | B2 | 12/2001 | Taguchi et al. |
| 6,424,199 | B2 | 7/2002 | Taguchi et al. |
| 6,509,763 | B2 | 1/2003 | Taguchi et al. |
| 6,784,714 | B2 * | 8/2004 | Nakamura ..................... 327/271 |
| 6,990,597 | B2 * | 1/2006 | Abe et al. ...................... 713/500 |
| 7,088,158 | B2 * | 8/2006 | Block et al. ................... 327/158 |
| 7,242,733 | B2 * | 7/2007 | Iwata ............................. 375/355 |
| 7,274,228 | B2 * | 9/2007 | Kim .............................. 327/149 |
| 7,453,324 | B2 * | 11/2008 | Partridge et al. ............. 331/154 |
| 7,456,665 | B2 * | 11/2008 | Hinz et al. .................... 327/158 |
| 7,532,081 | B2 * | 5/2009 | Partridge et al. ............. 331/154 |

(Continued)

FOREIGN PATENT DOCUMENTS

EP    1630795 A1    3/2006

(Continued)

OTHER PUBLICATIONS

Korean Office Action dated Oct. 4, 2010, issued in corresponding Korean Patent Application No. 10-2009-0031518.

(Continued)

*Primary Examiner* — Lincoln Donovan
*Assistant Examiner* — Adam Houston
(74) *Attorney, Agent, or Firm* — Westerman, Hattori, Daniels & Adrian, LLP

(57) ABSTRACT

In response to an input signal, in a first delay line, a delay amount is added to a phase of the input signal by each delay unit. In a DLL circuit, in response to an external signal that can be externally switched to a signal different in frequency is accepted, in a second delay line, a delay amount is added to the phase of the external signal by each delay unit. The phase of a delay signal delayed by all delay units of the second delay line and the phase of the external signal to which no delay amount added are compared to output a phase difference. A control voltage value that is a value for synchronizing the delay signal to be compared by the phase comparator and is generated from the phase difference output from the phase comparator is input to each of the delay units.

11 Claims, 12 Drawing Sheets

U.S. PATENT DOCUMENTS

| | | | | |
|---|---|---|---|---|
| 7,719,334 B2* | 5/2010 | Kwak | | 327/158 |
| 2003/0067333 A1* | 4/2003 | Nakamura | | 327/158 |
| 2003/0227310 A1* | 12/2003 | Iwata | | 327/165 |
| 2005/0151592 A1* | 7/2005 | Partridge et al. | | 331/16 |
| 2006/0192601 A1* | 8/2006 | Kim | | 327/149 |
| 2008/0007309 A1* | 1/2008 | Kim | | 327/149 |
| 2008/0065922 A1* | 3/2008 | Dour et al. | | 713/400 |
| 2008/0164953 A1* | 7/2008 | Partridge et al. | | 331/66 |
| 2009/0278619 A1* | 11/2009 | Partridge et al. | | 331/154 |
| 2009/0295441 A1* | 12/2009 | Kwak | | 327/158 |
| 2009/0295442 A1* | 12/2009 | Kwak | | 327/158 |
| 2010/0062726 A1* | 3/2010 | Zheng et al. | | 455/74 |

FOREIGN PATENT DOCUMENTS

| | | |
|---|---|---|
| JP | 11-7768 A | 1/1999 |
| JP | 2004-15689 A | 1/2004 |
| JP | 2007-293911 A | 11/2007 |
| KR | 10-2006-0135234 A | 12/2006 |

OTHER PUBLICATIONS

Partial European Search Report dated Oct. 17, 2011, issued in corresponding European Patent Application No. 09157845.0.

* cited by examiner

| FREQUENCY-DIVIDING RATIO | PLL OUTPUT (REF=20M) | | Δt (psec) | PHASE STEP (psec) |
|---|---|---|---|---|
| | (MHz) | (psec) | | |
| 28 | 560 | 1785.7 | 223.2 | 5.6 |
| 29 | 580 | 1724.1 | 161.6 | 4.0 |
| 30 | 600 | 1666.7 | 104.2 | 2.6 |
| 31 | 620 | 1612.9 | 50.4 | 1.3 |
| 32 | 640 | 1562.5 | 0.0 | 0.0 |
| 33 | 660 | 1515.2 | -47.3 | -1.2 |
| 34 | 680 | 1470.6 | -91.9 | -2.3 |
| 35 | 700 | 1428.6 | -133.9 | -3.3 |
| 36 | 720 | 1388.9 | -173.6 | -4.3 |

| DIVIDING RATIO | PLL OUTPUT (REF=20M) | | FIRST PHASE CONTROLLING UNIT | | SECOND PHASE CONTROLLING UNIT | |
|---|---|---|---|---|---|---|
| | (MHz) | (psec) | $\Delta t$ (psec) | Tap=10 (psec/Tap) | 8-BIT CONTROL (psec/Bit) | 10-BIT CONTROL (psec/Bit) |
| 4 | 80 | 12500.0 | 10938 | 1093.8 | 4.88 | 1.22 |
| 8 | 160 | 6250.0 | 4688 | 468.8 | 2.44 | 0.61 |
| 16 | 320 | 3125.0 | 1568 | 156.3 | 1.22 | 0.31 |
| 32 | 640 | 1562.5 | 0 | 0.0 | 0.61 | 0.15 |
| 64 | 1280 | 781.3 | -781 | -78.1 | 0.31 | 0.08 |
| 128 | 2560 | 390.6 | -1172 | -117.2 | 0.15 | 0.04 |

FIG.20

| DIVIDING RATIO | PLL OUTPUT (REF=20M) | | Δt (psec) | FIRST PHASE CONTROLLING UNIT | SECOND PHASE CONTROLLING UNIT | |
|---|---|---|---|---|---|---|
| | (MHz) | (psec) | | Tap=4 (psec/Tap) | 8-BIT CONTROL (psec/Bit) | 10-BIT CONTROL (psec/Bit) |
| 4 | 80 | 12500.0 | 10938 | 2734.4 | 12.21 | 3.05 |
| 8 | 160 | 6250.0 | 4688 | 1171.9 | 6.10 | 1.53 |
| 16 | 320 | 3125.0 | 1568 | 390.6 | 3.05 | 0.76 |
| 32 | 640 | 1562.5 | 0 | 0.0 | 1.53 | 0.38 |
| 64 | 1280 | 781.3 | -781 | -195.3 | 0.76 | 0.19 |
| 128 | 2560 | 390.6 | -1172 | -293.0 | 0.38 | 0.10 |

FIG.21

| DIVIDING RATIO | PLL OUTPUT (REF=20M) | | Δt (psec) | nTap | FIRST PHASE CONTROLLING UNIT | SECOND PHASE CONTROLLING UNIT | |
|---|---|---|---|---|---|---|---|
| | (MHz) | (psec) | | | nTap (psec/Tap) | 8-BIT CONTROL (psec/Bit) | 10-BIT CONTROL (psec/Bit) |
| 4 | 80 | 12500.0 | 10938 | 32 | 341.8 | 1.53 | 0.38 |
| 8 | 160 | 6250.0 | 4688 | 16 | 293.0 | 1.53 | 0.38 |
| 16 | 320 | 3125.0 | 1568 | 8 | 195.3 | 1.53 | 0.38 |
| 32 | 640 | 1562.5 | 0 | 4 | 0.0 | 1.53 | 0.38 |
| 64 | 1280 | 781.3 | -781 | 2 | -390.6 | 1.53 | 0.38 |
| 128 | 2560 | 390.6 | -1172 | 1 | -1171.9 | 1.53 | 0.38 |

PHASE CONTROLLING APPARATUS, PHASE-CONTROL PRINTED BOARD, AND CONTROLLING METHOD

CROSS-REFERENCE TO RELATED APPLICATIONS

This application is based upon and claims the benefit of priority of the prior Japanese Patent Application Nos. 2008-104051, filed on Apr. 11, 2008; and 2009-069107, filed on Mar. 19, 2009, the entire contents of which are incorporated herein by reference.

FIELD

The embodiments discussed herein are directed to a phase controlling apparatus, a phase-control printed board, and a phase-control controlling method.

BACKGROUND

Conventionally, various techniques have been known for obtaining an output signal with its phase being adjusted. For example, a Delay Locked Loop (DLL) is one of such techniques for obtaining an output signal with its phase being adjusted. In the DLL, for example, a delay unit that adds a delay amount to a phase is used. In the DLL, the delay unit adds the delay amount to the phase of an input signal, and a delay signal delayed in phase in comparison with the phase of the input signal is taken as an output signal. Japanese Laid-open Patent Publication Nos. 2007-293911, H11-7768, and 2004-15689 each disclose a scheme of correcting a phase shift between an input signal and a clock signal.

Meanwhile, the conventional technologies mentioned above have a problem in which the phase of the output signal cannot be finely adjusted.

For example, in the conventional technologies, each delay unit adds to the phase of the input signal a delay amount equal to or greater than a predetermined minimum value and equal to or smaller than a predetermined maximum value. Here, the predetermined minimum value is a propagation delay time of the delay unit itself, representing a phase resolution among delay units. Therefore, in the conventional technologies, the delay amount to be added to the phase of the input signal cannot be equal to or smaller than the predetermined minimum value, thereby making it impossible to finely adjust the phase of the output signal so that the phase is equal to or smaller than the predetermined minimum value. The three patent documents mentioned above do not disclose a technique of finely adjusting the phase of the output signal.

SUMMARY

According to an aspect of an embodiment, a phase controlling apparatus includes a first delay line with delay units adding a delay amount to a phase of a signal, the first delay line over which, when an input of an input signal is accepted, a delay amount is added by each of the delay units to a phase of the input signal and a delay signal for each of the delay units is output; and a DLL circuit. The DLL circuit includes a second delay line with delay units, the second delay line over which, when an input of an external signal that can be externally switched to a signal different in frequency, a delay amount is added by each of the delay units to a phase of the external signal; a phase comparator that compares a phase of a delay signal delayed by all of the delay units of the second delay line and a phase of the external signal to which no delay amount is added on the second delay line to output a phase difference; and a delay-unit controlling circuit that inputs, to each of the delay units of the first delay line and the delay units of the second delay line, a control voltage value that is a value for synchronizing the delay signal to be compared by the phase comparator with the external signal and is generated from the phase difference output from the phase comparator.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 20 is a table for explaining an effect of the fourth embodiment;

FIG. 21 is a table for explaining an effect of the fourth embodiment; and

DETAILED DESCRIPTION OF THE PREFERRED EMBODIMENTS

With reference to the attached drawings, embodiments of the phase controlling apparatus, phase-control printed board, and controlling method according to the present invention are explained in detailed below. Note in the following that a general outline of a phase controlling apparatus according to a first embodiment, the configuration and process flow of the phase controlling apparatus, and then effects of the phase controlling apparatus according to the first embodiment are explained in sequence, and then other embodiments are explained.

[a] First Embodiment

General Outline of the Configuration of the Phase Controlling Apparatus

Figure 1:
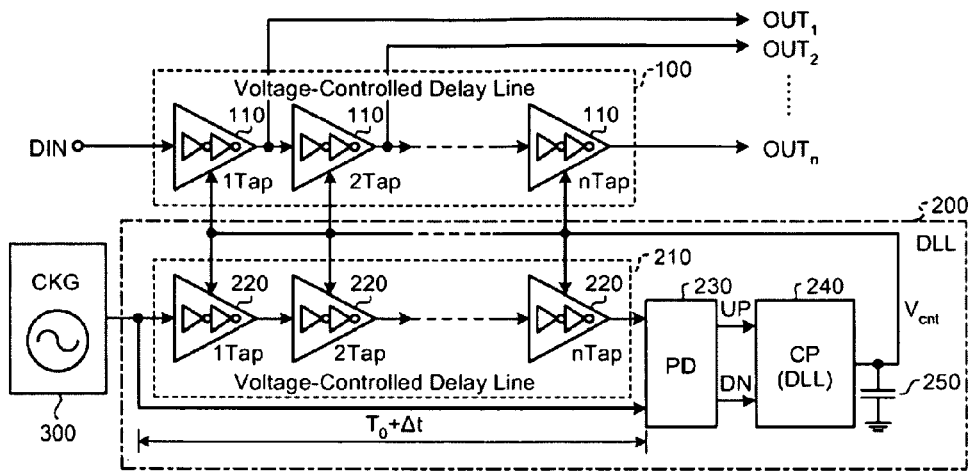
FIG. 1 is a diagram for depicting an example of the configuration of a phase controlling apparatus according to a first embodiment.

First, with reference to FIG. 1, a general outline of the configuration of a phase controlling apparatus is briefly explained. Note in the following that, with reference to FIG. 1, the general outline of the phase controlling apparatus according to the first embodiment is briefly explained first, and then the configuration of the phase controlling apparatus according to the first embodiment is explained. FIG. 1 is a diagram for depicting an example of the configuration of the phase controlling apparatus according to the first embodiment.

As depicted in FIG. 1, the phase controlling apparatus according to the first embodiment includes a voltage-controlled delay line (for input signal) 100 and a delay locked loop (DLL) circuit 200. Also, the phase controlling apparatus according to the first embodiment includes a clock generator (CKG) 300.

Here, the voltage-controlled delay line (for input signal) 100 adds a delay amount (delay time) to the phase of an input signal. Specifically, delay units (for input signal) 110 disposed in the voltage-controlled delay line (for input signal) 100 each adds a delay amount to the input signal. Then, as represented by "$OUT_1$" to "$OUT_n$" in FIG. 1, the voltage-controlled delay line (for input signal) 100 outputs a delay signal, which is an input signal to which the delay amount is added by each of the delay unit (for input signal) 110.

Also, the clock generator 300 outputs an external signal to the DLL circuit 200. Also, in the DLL circuit 200, a delay amount (delay time) equivalent to one cycle is added by each of delay units (for DLL) 220 disposed in the DLL circuit 200 to the phase of the external signal output from the clock generator 300.

Here, as will be explained in detail below, the delay units (for input signal) 110 and delay units (for DLL) 220 disposed in the DLL circuit 200 each add the same delay amount to the signal. Specifically, the delay units (for input signal) 110 each add to the input signal the same delay amount as the delay amount added by each of the delay units (for DLL) 220 to the external signal.

That is, for example, when the frequency of the external signal output from the clock generator 300 is switched by a user using the phase controlling apparatus according to the first embodiment to change the length equivalent to one cycle, the delay amount to be added by each delay unit (for DLL) 220 to the external signal is changed. Also, when the delay amount to be added by each delay unit (for DLL) 220 to the external signal is changed, the delay amount to be added by each delay unit (for input signal) 110 to the input signal is changed in a manner similar to that for each delay unit (for DLL) 220.

For this reason, in the phase controlling apparatus according to the first embodiment, as will be explained in detail below, the frequency of an external signal different from the input signal is switched, thereby finely adjusting the delay amount to be added by the delay unit (for input signal) 110 to the input signal. With this, the phase controlling apparatus according to the first embodiment can perform a conventionally-impossible fine phase control of an output signal.

Configuration of the Phase Controlling Apparatus

Next, the configuration of the phase controlling apparatus according to the first embodiment is explained. In the following, of the configuration of the phase controlling apparatus according to the first embodiment, an example of the configuration of the voltage-controlled delay line (for input signal) 100 is explained. Then, an example of the DLL circuit 200 included in the phase controlling apparatus according to the first embodiment is explained. And then an example of the clock generator 300 included in the phase controlling apparatus according to the first embodiment is explained. The voltage-controlled delay line (for input signal) 100 is also referred to as a "first delay line".

Voltage-Controlled Delay Line (for Input Signal)

First, an example of the configuration of the voltage-controlled delay line (for input signal) 100 is explained by using FIG. 1. As depicted in FIG. 1, the voltage-controlled delay line (for input signal) 100 includes a plurality of delay units (for input signal) 110 coupled in series and connected to the DLL circuit 200. Specifically, in the voltage-controlled delay line (for input signal) 100, the delay units (for input signal) 110 are connected to the DLL circuit 200 via a capacitor 250 included in the DLL circuit 200.

Also, in the voltage-controlled delay line (for input signal) 100, an input signal is accepted, a delay amount (delay time) is added to the phase of the accepted input signal, and then a delay signal is output. Specifically, each of the delay units (for input signal) 110 disposed in the voltage-controlled delay line (for input signal) 100 adds the delay amount to the phase of the input signal. Together with adding the delay amount to the phase of the input signal, in the voltage-controlled delay line (for input signal) 100, a delay signal for each of the delay units (for input signal) 110 is output to the outside of the voltage-controlled delay line (for input signal) 100.

The input signal input to the voltage-controlled delay line (for input signal) 100 is a signal whose phase is to be finely adjusted, and corresponds to data or a clock signal, for example.

Here, outputting delay signals to the outside of the voltage-controlled delay line (for input signal) 100 is further specifically explained. In the voltage-controlled delay line (for input signal) 100, a delay signal with a delay amount added by all or part of the delay units (for input signal) 110 coupled in series is output between the delay units (for input signal) 110.

In FIG. 1 depicting a specific example, in the voltage-controlled delay line (for input signal) 100, a delay signal with a delay amount added by a delay unit "1Tap" is output as "$OUT_1$". Also, in the voltage-controlled delay line (for input signal) 100, a delay signal with a delay amount added by the delay unit "1Tap" and a delay unit "2Tap" is output as "OUT$_2$". Furthermore, in the voltage-controlled delay line (for input signal) 100, a delay signal with a delay amount added by all delay units ("1Tap" to "nTap") is output as "OUT$_n$".

Here, each of the delay units (for input signal) 110 is briefly explained. For example, the delay unit (for input signal) 110 corresponds to a combination of two inverters.

Also, the delay amount of the delay unit (for input signal) 110 to be added to the phase of the input signal is determined by a control voltage provided by the capacitor 250 included in the DLL circuit 200. Also, the delay amount is equal to or greater than a predetermined minimum amount and equal to or smaller than a predetermined maximum amount, falling within a predetermined range. In other words, the delay amount is not equal to or smaller than the predetermined minimum delay amount.

Furthermore, the predetermined minimum amount of the delay amount to be added by the delay unit (for input signal) 110 is a propagation delay amount of the delay unit (for input signal) 110 itself. In other words, the predetermined minimum amount is a delay amount by which a signal is always delayed with propagating through the delay unit (for input signal) 110. As for the minimum delay time, if the phase controlling apparatus is implemented by a large scale integrated circuit (LSI), the speed is increased (the minimum amount is decreased) as the LSI is more microfabricated. A phase resolution, however, is restricted to be on the order of several tens of picoseconds.

DLL Circuit

Next, an example of the configuration of the DLL circuit 200 is explained by using FIG. 1. The phase controlling apparatus according to the first embodiment has a voltage-controlled delay line (for DLL) 210 and a phase comparator (phase detector (PD)) 230 included in the DLL circuit 200. Also, the phase controlling apparatus according to the first embodiment includes a charge pump (CP) 240 and the capacitor (C) 250.

The voltage-controlled delay line (for DLL) 210 is also referred to as a "second delay line", the phase comparator 230 to as a "phase comparator" in the claim, and the capacitor 250 to as a "delay-unit controlling circuit".

The voltage-controlled delay line (for DLL) 210 includes the delay units (for DLL) 220 (Taps) that each add a delay amount to the phase of a signal. For example, in the example depicted in FIG. 1, the voltage-controlled delay line (for DLL) 210 includes the delay units (for DLL) 220 coupled in series. Also, the voltage-controlled delay line (for DLL) 210 is connected to the phase comparator 230 and the clock generator 300. Furthermore, each of the delay units (for DLL) 220 included in the voltage-controlled delay line (for DLL) 210 is connected to the capacitor 250.

Still further, in the voltage-controlled delay line (for DLL) 210, when an input of an external signal is accepted from outside of the DLL circuit 200, each of the delay units (for DLL) 220 adds a delay amount to the phase of the external signal.

Here, the external signal is a signal that can be switched outside to a signal different in frequency. Also, the external signal can be arbitrary as long as it is a signal capable of finely changing the delay amount to be added by each of the delay units (for DLL) 220 at the DLL circuit 200. For example, a clock signal is used.

Specifically, the voltage-controlled delay line (for DLL) 210 accepts an input of an external signal from the clock generator 300. Then, in the voltage-controlled delay line (for DLL) 210, the external signal is input to one end of the delay units (for DLL) 220 coupled in series, and then each of the delay units (for DLL) 220 adds the delay amount to the external signal.

Also, the voltage-controlled delay line (for DLL) 210 outputs a delay signal obtained by delaying by all of the delay units (for DLL) 220 to the phase comparator 230. Specifically, the voltage-controlled delay line (for DLL) 210 outputs the delay signal to the phase comparator 230 from an end of the delay units (for DLL) 220 coupled in series that is different from the end to which the external signal is input, that is, a delay unit (for DLL) 220 of the last stage. Specifically, for example, the voltage-controlled delay line (for DLL) 210 outputs to the phase comparator 230 a delay signal with a delay amount added by all of the delay units (for DLL) 220 ("nTap" to "nTap").

Here, the delay amount of the delay unit (for DLL) 220 to be added to the phase of the input signal is determined by a control voltage provided by the capacitor 250 included in the DLL circuit 200. Also, the delay unit (for DLL) 220 is a delay unit with functions similar to those of the delay unit (for input signal) 110.

In the first embodiment, the voltage-controlled delay line (for input signal) 100 and the voltage-controlled delay line (for DLL) 210 have the same configuration. Specifically, the voltage-controlled delay line (for input signal) 100 and the voltage-controlled delay line (for DLL) 210 have the same number of delay units. Also, each of the delay units included in the voltage-controlled delay line (for input signal) 100 and the voltage-controlled delay line (for DLL) 210 adds the same delay amount by using the same control voltage supplied by the capacitor 250.

The phase comparator 230 is connected to the voltage-controlled delay line (for DLL) 210, the charge pump (for DLL) 240, and the clock generator 300. Also, the phase comparator 230 is connected to the voltage-controlled delay line (for DLL) 210 via the delay unit (for DLL) 220 of the last stage of the delay units (for DLL) 220 included in the voltage-controlled delay line (for DLL) 210.

The phase comparator 230 compares the phases of two signals. Specifically, the phase comparator 230 accepts from the voltage-controlled delay line (for DLL) 210 the delay signal obtained by delaying by all of the delay units (for DLL) 220 of the voltage-controlled delay line (for DLL) 210. The phase comparator 230 accepts from the clock generator 300 the external signal. Also, the phase comparator 230 compares the phase of the delay signal accepted from the voltage-controlled delay line (for DLL) 210 and the phase of the external signal output by the clock generator 300. Then, the phase comparator 230 transfers the comparison result (phase difference) to the charge pump (for DLL) 240.

Specifically, for example, when it is found based on the phase difference between two signals that the phase of the delay signal advances compared with the external signal, the phase comparator 230 transfers the phase difference to the charge pump (for DLL) 240 as a down-signal pulse. When the phase of the delay signal delays compared with the external signal, the phase comparator 230 transfers the phase difference to the charge pump (for DLL) 240 as an up-signal pulse.

The charge pump (for DLL) 240 is connected to the phase comparator 230 and the capacitor 250. Also, when the comparison result is transferred from the phase comparator 230, the charge pump (for DLL) 240 supplies a current corresponding to the comparison result to the capacitor 250.

Specifically, when the phase difference is transferred from the phase comparator 230, the charge pump (for DLL) 240 converts the phase difference transferred from the phase comparator 230 to a current, and then charges the current to the capacitor 250 or discharges the current from the capacitor 250. Here, when the phase difference is transferred from the phase comparator 230 as an up-signal pulse, the charge pump (for DLL) 240 charges the current to the capacitor 250. When the phase difference is transferred from the phase comparator 230 as a down-signal pulse, the charge pump (for DLL) 240 discharges the current from the capacitor 250.

The capacitor 250 is connected to the charge pump (for DLL) 240 and each of the delay units (for DLL) 220 included in the voltage-controlled delay line (for DLL) 210. Also, the capacitor 250 is connected to each of the delay units (for input signal) 110 included in the voltage-controlled delay line (for input signal) 100.

Also, the capacitor 250 inputs a control voltage generated and controlled with the phase difference output by the phase comparator 230 to each of the delay units (for DLL) 220 of the voltage-controlled delay line (for DLL) 210. Furthermore, the capacitor 250 inputs the control voltage to each of the delay units (for input signal) 110 of the voltage-controlled delay line (for input signal) 100. Here, the capacitor 250 inputs to each of the delay units (for input signal) 110 and each of the delay units (for DLL) 220 the same control voltage.

Specifically, in the capacitor 250, a current is charged or discharged by the charge pump (for DLL) 240. Here, in the capacitor 250, the current charged or discharged by the charge pump (for DLL) 240 is integrated with the capacitance of the capacitor 250 to produce a control voltage. The capacitor 250 inputs the control voltage to each of the delay units (for DLL) 220 included in the voltage-controlled delay line (for DLL) 210 and each of the delay units (for input signal) 110 included in the voltage-controlled delay line (for input signal) 100.

Here, in the DLL circuit 200, the phase difference between the delay signal and the external signal is always monitored by the phase comparator 230 and a process is performed so that the phase difference between these two signals is solved. A state where the phase difference between these two has been solved is such that the delay signal is synchronized with the external signal with a delay by one cycle. Specifically, in the DLL circuit 200, the comparison result is fed back from the phase comparator 230 via the charge pump (for DLL) 240 to the capacitor 250. With this, the control voltage of the capacitor 250 has a value synchronizing the delay signal to be compared by the phase comparator 230 with the external signal with a delay by one cycle. Thus, a delay signal obtained by delaying by all of the delay units (for DLL) 220 is a signal phase-synchronized with the external signal with a delay by one cycle.

Specifically, in the DLL circuit 200, a control is performed so that the external signal itself output from the clock generator 300 and the delay signal obtained by adding the delay amount to the external signal in the voltage-controlled delay line (for DLL) 210 is phase-synchronized with a delay by one cycle. With this, in the DLL circuit 200, a control voltage ($V_{cnt}$) corresponding to a delay by one cycle of the external signal is generated, and is then supplied to the capacitor 250. Also, in the DLL circuit 200, the capacitor 250 supplies the control voltage ($V_{cnt}$) also to the voltage-controlled delay line (for input signal) 100. With this, in the voltage-controlled delay line (for input signal) 100, a delay amount equivalent to one cycle of an external signal different from the input signal output by the clock generator 300 is added to the input signal.

General Outline of the Configuration of the Clock Generator

Figure 2:
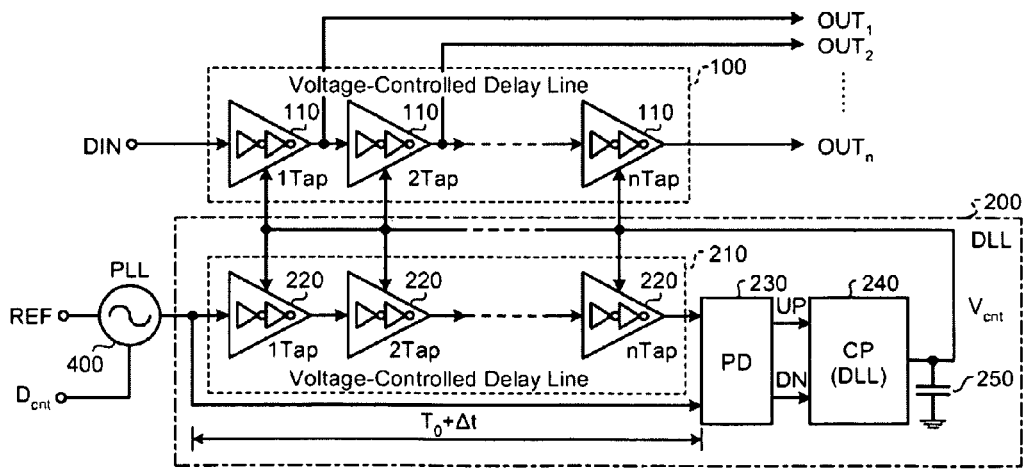
FIG. 2 is a diagram for depicting an example of the configuration of the phase controlling apparatus according to the first embodiment when a PLL circuit is used.

Next, a general outline of the configuration of the clock generator 300 is explained by using FIG. 2. The clock generator 300 outputs an external signal to the DLL circuit 200. In the following, as depicted in FIG. 2, a technique of achieving the clock generator 300 by using the phase-locked loop (PLL) circuit 400 is exemplarily explained.

FIG. 2 is a diagram for depicting an example of the configuration of the phase controlling apparatus according to the first embodiment when a PLL circuit is used. The clock generator 300 can be arbitrary as long as it can arbitrarily switch the frequency of an output external signal, and the present invention is therefore not restricted to a technique of achieving the clock generator 300 by using the phase-synchronizing circuit 400. For example, a voltage-controlled oscillator (VCO) may be used for achievement.

As depicted in FIG. 2, the phase-synchronizing circuit 400 is connected to the DLL circuit 200. Specifically, the phase-synchronizing circuit 400 is connected to one end of the delay units (for DLL) 220 coupled in series included in the voltage-controlled delay line (for DLL) 210.

Also, as depicted in FIG. 2, when a reference signal as represented by "REF" in FIG. 2 is input from outside of the phase-synchronizing circuit 400, the phase-synchronizing circuit 400 adjusts the frequency of the reference signal to produce an external signal. Specifically, as will be explained further below, the phase-synchronizing circuit 400 uses a control signal as represented by "$D_{cnt}$ (Divider Control)" in FIG. 2 to adjust the frequency of the reference signal to produce an external signal. Then, the phase-synchronizing circuit 400 transfers the external signal to the voltage-controlled delay line (for DLL) 210.

In the following, it is assumed that the reference signal input from outside of the phase-synchronizing circuit 400 is a constant signal, and a technique of switching the frequency of the reference signal by the phase-synchronizing circuit 400 is explained.

Configuration of the Phase-Synchronizing Circuit

Figures 3, 4:
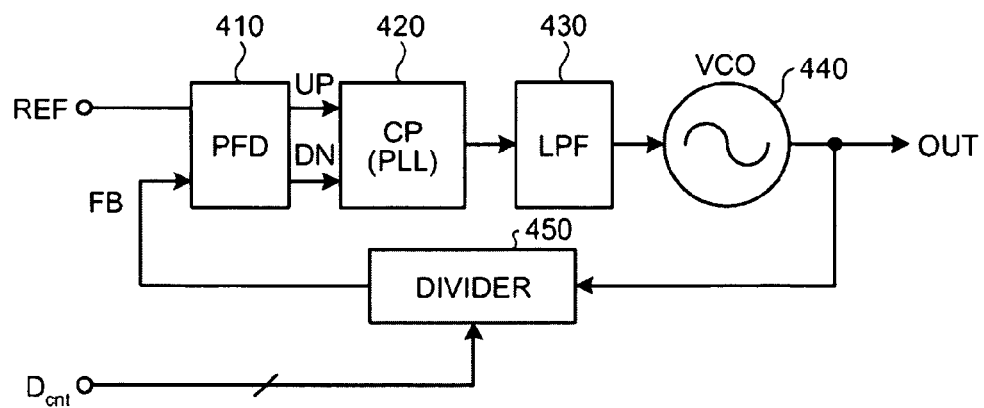
FIG. 3 is a diagram for depicting an example of the configuration of a PLL phase-synchronizing circuit in the first embodiment.
FIG. 4 is a diagram for explaining a frequency-dividing circuit in the first embodiment.

Next, an example of the configuration of the phase-synchronizing circuit 400 is explained by using FIGS. 3 and 4. FIG. 3 is a diagram for depicting an example of the configuration of the phase-synchronizing circuit in the first embodiment. FIG. 4 is a diagram for explaining a frequency-dividing circuit in the first embodiment.

As depicted in FIG. 3, the phase-synchronizing circuit 400 includes a phase frequency comparator (phase frequency detector (PFD) 410, and a charge pump (for PLL) 420, a low pass filter (LPF) 430. Also, the phase-synchronizing circuit 400 includes a voltage-controlled oscillator (VCO) 440 and a frequency-dividing circuit (divider) 450.

With the reference signal as an input, the phase-synchronizing circuit 400 as configured above generates an external signal obtained by adjusting the frequency of the reference signal to a frequency specified by a frequency-dividing ratio of the frequency-dividing circuit 450 in the phase synchronizing circuit 400. The phase-synchronizing circuit 400 then transfers the external signal to the voltage-controlled delay line (for DLL) 210, Note that the configuration of the phase-synchronizing circuit 400 explained below other than the frequency-dividing circuit 450 is similar to the configuration of a general PLL.

The phase-frequency comparator 410 connects the charge pump (for PLL) 420 and the frequency-dividing circuit 450 together. Also, the phase-frequency comparator 410 compares the phases of two signals.

Specifically, the phase-frequency comparator 410 accepts an input of the reference signal from outside of the phase-synchronizing circuit 400 in which the phase-frequency comparator 410 is installed. Also, the phase-frequency comparator 410 accepts a feedback of the external signal from the frequency-dividing circuit 450. The phase-frequency comparator 410 then compares the phase of the reference signal and the phase of the external signal. The phase-frequency comparator 410 then transfers the comparison result (phase difference) to the charge pump (for PLL) 420.

Specifically, for example, when it is found based on the phase difference between two signals that the phase of the reference signal advances compared with the external signal, the phase-frequency comparator 410 transfers the phase difference to the charge pump (for PLL) 420 as an up-signal pulse. When the phase of the reference signal delays compared with the external signal, the phase-frequency comparator 410 transfers the phase difference to the charge pump (for PLL) 420 as a down-signal pulse.

The charge pump (for PLL) 420 is connected to the phase-frequency comparator 410 and the low pass filter 430.

When the comparison result is transferred from the phase-frequency comparator 410, the charge pump (for PLL) 420 transfers a current corresponding to the comparison result to the low pass filter 430. Specifically, the charge pump (for PLL) 420 converts the phase difference transferred from the phase-frequency comparator 410 to a current. The charge pump (for PLL) 420 then transfers the current to the low pass filter 430.

The low pass filter 430 is connected to the charge pump (for PLL) 420 and the voltage-controlled oscillator 440. Also, when a current is transferred from the charge pump (for PLL) 420, the low pass filter 430 attenuates and breaks a frequency signal higher than a specific threshold. The low pass filter 430 then lets only low frequencies of the current to pass for transfer to the voltage-controlled oscillator 440.

The voltage-controlled oscillator 440 is connected to the low pass filter 430 and the frequency-dividing circuit 450. Also, the voltage-controlled oscillator 440 is connected to the DLL circuit 200.

The voltage-controlled oscillator 440 is an oscillator that controls an oscillation frequency with voltage to oscillate an external signal. Specifically, the voltage-controlled oscillator 440 uses a voltage output from the low pass filter 430 to oscillate a signal. Here, the signal oscillated by the voltage-controlled oscillator 440 is an external signal. The voltage-controlled oscillator 440 then transfers the external signal to the frequency-dividing circuit 450 and also to the DLL circuit 200 (the voltage-controlled delay line (for DLL) 210).

The frequency-dividing circuit 450 switches the frequency of the external signal. Specifically, the frequency of the external signal transferred from the voltage-controlled oscillator 440 is switched, and then transfers the switched external signal to the phase-frequency comparator 410.

Also, the frequency-dividing circuit 450 accepts a control signal specified by a user using the phase controlling apparatus according to the first embodiment, and switches the frequency of the external signal by using a frequency-dividing ratio (a PLL multiplication number) specified by the control signal.

A specific explanation is made by using an example depicted in FIG. 4. It is assumed for explanation herein that the reference signal is 20 MHz and the number of delay units (for DLL) 220 included in the voltage-controlled delay line (for DLL) 210 is 40. It is also assumed for explanation herein that a frequency-dividing ratio of 32 is a reference.

For example, an example is explained in which the frequency-dividing ratio is switched from 32 to 31 with the control signal input by a user. In this case, the external signal output from the phase-synchronizing circuit 400 ("PLL output" depicted in FIG. 4) is switched from 640 MHz to 620 MHz as depicted in FIG. 4. Also, with frequency switching, the delay amount equivalent to one cycle of the external signal to be added to the voltage-controlled delay line (for DLL) 210 is changed from 1562.5 picoseconds to 1612.9 picoseconds. That is, the cycle of the external signal is changed by 50.4 picoseconds (equivalent to $\Delta t$). Here, since the delay amount to be added by each of the delay units is equivalent to one cycle of the external signal, the total of delay amounts added by the respective delay units is changed by 50.4 picoseconds.

Here, since each of the delay units adds the delay amount by using the same control voltage, each of the delay units adds the same delay amount. For this reason, when there are 40 delay units (for DLL) 220, 50.4 picoseconds is equally distributed to these 40 delay units (for DLL) 220. With this, the delay amount to be added by each of the delay units (for DLL) 220 is changed by 1.3 picoseconds per unit.

It is assumed herein that the initial cycle of the external signal output from the phase-synchronizing circuit 400 is $T_0$. It is also assumed that the number of delay units (for DLL) 220 included in the voltage-controlled delay line (for DLL) 210 is "n". If is further assumed that the frequency-dividing circuit 450 changes the cycle of the external signal by $\Delta t$. Here, the cycle after switching becomes $T_0 + \Delta t$. With this, the delay amount (phase step amount) to be added by each of the delay units after the cycle of the external signal is switched is changed to the phase step amount=$\Delta t/n$.

Process in the Phase Controlling Apparatus

Figure 5:
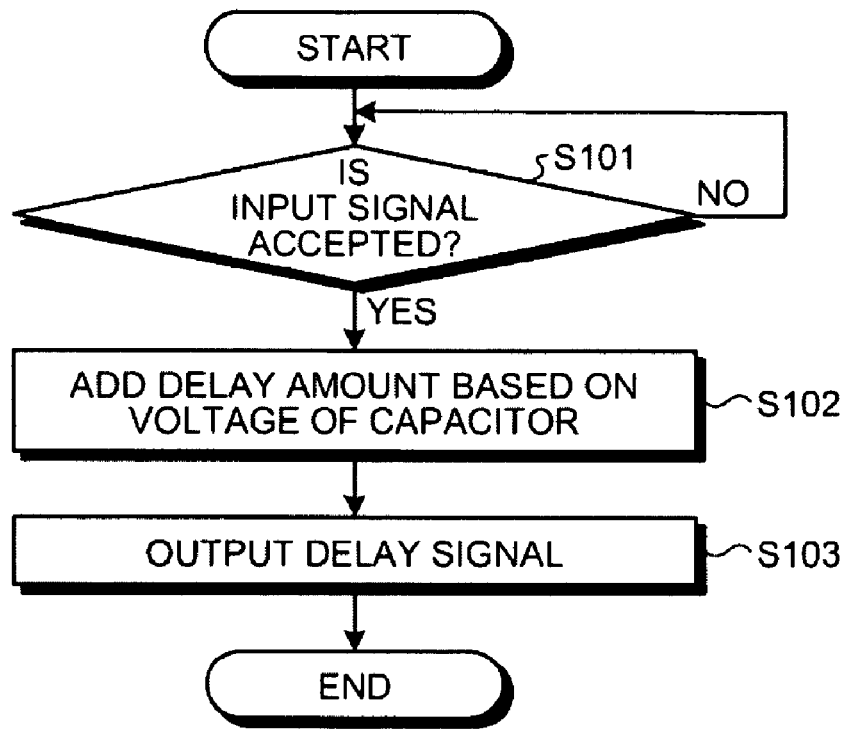
FIG. 5 is a flowchart for explaining a flow of process by a voltage-controlled delay line (for input signal) in the first embodiment.
Figure 6:
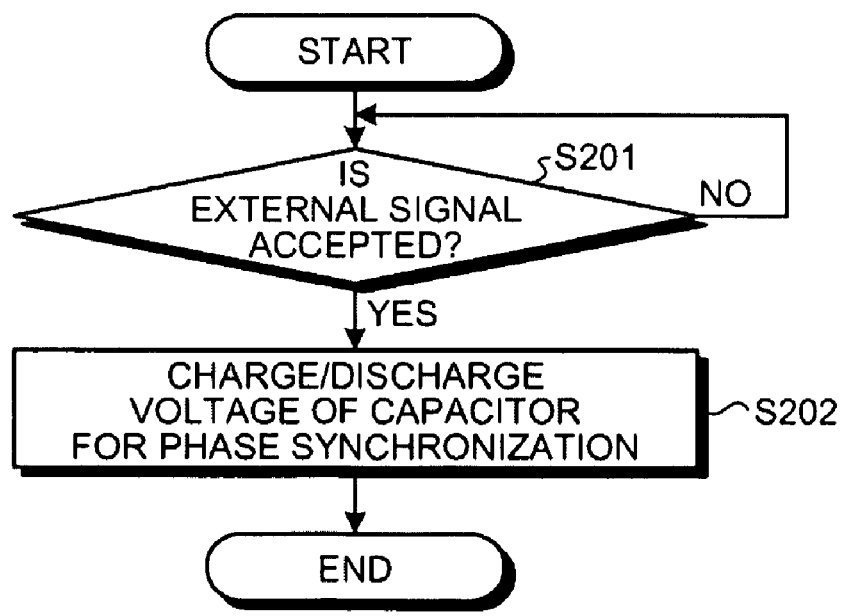
FIG. 6 is a flowchart for explaining a flow of process by a DLL circuit in the first embodiment.

Next, a flow of a process by the phase controlling apparatus according to the first embodiment is briefly explained by using FIGS. 5 and 6. In the following, a flow of process in the voltage-controlled delay line (for input signal) 100 is briefly explained first by using FIG. 5, and then a flow of process in the DLL circuit 200 is briefly explained by using FIG. 6. FIG. 5 is a flowchart for explaining the flow of process by the voltage-controlled delay line (for input signal) in the first embodiment. FIG. 6 is a flowchart for explaining the flow of process by the DLL circuit in the first embodiment.

First, the flow of process in the voltage-controlled delay line (for input signal) 100 is briefly explained by using FIG. 5. As depicted in FIG. 5, in the voltage-controlled delay line (for input signal) 100, when an input of the input signal is accepted ("Yes" at Step S101), each of the delay units (for input signal) 110 adds a delay amount to the phase of the input signal (Step S102). Specifically, each of the delay units (for input signal) 110 gives to the input signal a delay amount uniquely determined based on the voltage of the capacitor 250. Then, the each of the delay units (for input signal) 110 outputs a delay signal for each of the delay units (for input signal) 110 to the outside of the DLL circuit 200 (Step S103).

Next, an example of the process in the DLL circuit 200 is explained by using FIG. 6. As depicted in FIG. 6, in the DLL circuit 200, when an external signal is present ("Yes" at Step S201), the voltage of the capacitor is charged/discharged for phase synchronization (Step S202). Specifically, in the DLL circuit 200, the phase difference between the delay signal and the external signal is always monitored by the phase comparator 230, and a process is performed so that the phase difference between these two signals is solved. Then, the control voltage of the capacitor 250 becomes at a value which the delay signal compared by the phase comparator 230 is synchronized with the external signal.

According to the first embodiment, when the phase controlling apparatus accepts an input of the input signal, the delay amount is added to the phase of the input signal by each of the delay units (for input signal) 110 that add the delay amount to the phase of a signal, and a delay signal for each of the delay units (for input signal) 110 is output. Also, according to the phase controlling apparatus, the DLL circuit 200 is provided. In the DLL circuit 200, upon accepting an input of the external signal, the delay amount is added to the phase of the external signal by each of the delay units (for DLL) 220. Furthermore, according to the phase controlling apparatus, the phase of the delay signal delayed by all of the delay units (for DLL) 220 of the voltage-controlled delay line (for DLL) 210 and the phase of the external signal with no delay amount added in the voltage-controlled delay line (for DLL) 210 are compared with each other. Then, according to the phase controlling apparatus, a control voltage value synchronizing the delay signal compared by the phase comparator 230 with the external signal is input to each of the delay units included in the voltage-controlled delay line (for input signal) 100 and the voltage-controlled delay line (for DLL) 210. With this, according to the first embodiment, the phase of the output signal can be finely controlled.

Specifically, in the conventional technologies, each of the delay units can control the delay amount within a predetermined range, but has a minimum delay amount. For this reason, in the conventional technologies, phase control is restricted to be in units of several tens of picoseconds. The minimum delay amount is a minimum amount of delay that will be provided to an input signal as long as the input signal is delayed by using the delay unit. Therefore, the delay amount of the delay unit cannot be decreased to be smaller than the minimum delay amount.

Figure 7:
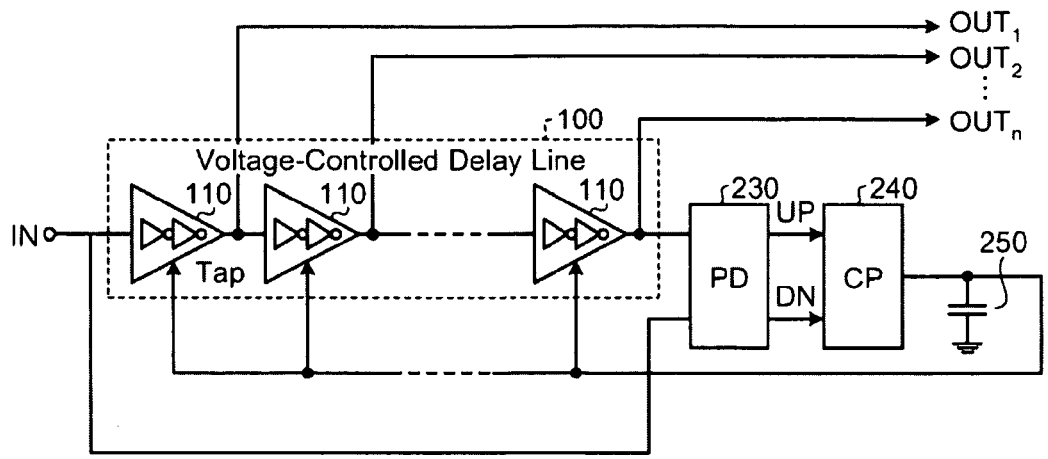
FIG. 7 is a diagram for explaining an effect of the phase controlling apparatus according to the first embodiment.

According to the first embodiment, the phase controlling apparatus inputs a frequency-switchable external signal to the voltage-controlled delay line to generate a control voltage equivalent to a delay by one cycle. Then, the phase controlling apparatus supplied the control voltage generated from the external signal, which is different from the input signal, to the voltage-controlled delay line on an input signal side. With this, according to the first embodiment, unlike the conventional DLL circuit as depicted in FIG. 7, fine phase control of the output signal can be achieved. FIG. 7 is a diagram for explaining effects of the phase controlling apparatus according to the first embodiment.

Figure 8:
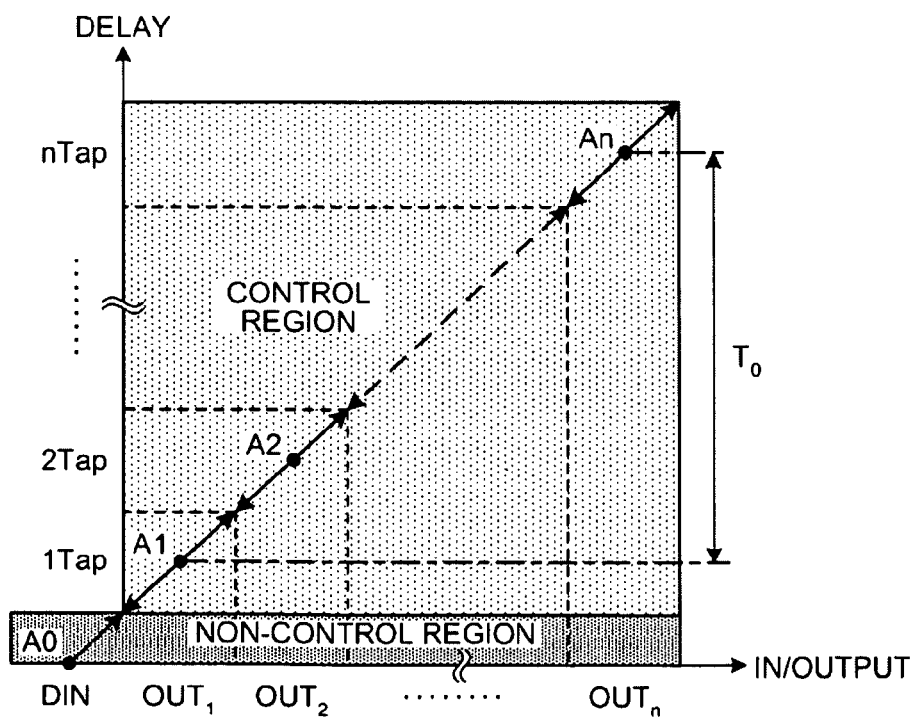
FIG. 8 is a diagram for explaining an effect of the phase controlling apparatus according to the first embodiment.

Here, a relation between each output signal and a delay amount is explained by using FIG. 3. In FIG. 8, the horizontal axis represents each output signal ("Output" in FIG. 8), whilst the vertical axis represents each delay amount to be added to the output signal. It is assumed herein that there are "n" delay units and the output signals are represented as "$OUT_1$" to "$OUT_n$". Also, the vertical axis represents a range of the delay amount to be added by each delay unit. FIG. 8 is a diagram for explaining effects of the phase controlling apparatus according to the first embodiment.

Here, "tug" in FIG. 8 represents an input signal. "DIN" in FIG. 8 represents an input signal. Also, the "non-control region" in FIG. 8 represents a minimum delay amount to be added to the input signal from the voltage-controlled delay line. Specifically, the "non-control region" represents a total of minimum delay amounts to be added by n delay units to the input signal.

Also, a "control region" in FIG. 8 represents a range of the delay amount that can be changed from among the delay amounts that can be added by each delay unit. The delay amount given by each delay unit is equal to or larger than a predetermined minimum value and equal to or smaller than a predetermined maximum value. Therefore, the total of minimum values given to the input signal by the respective delay units (offset amount) corresponds to a portion represented by the "non-control region". In addition to the "non-control region", a range of the delay amount that may possibly be given to the input signal by each delay unit corresponds to a portion represented by a "control region".

Also, "A1" to "An" in FIG. 8 each represent a phase-synchronizing point. Specifically, these each represent a delay amount to be added to the external signal by each delay unit when the delay signal compared by the phase comparator 230 is synchronized with the external signal with a delay by one cycle. Thus, the total of delay amounts to be added to the input signal by the respective delay units corresponds to the portion represented by the "non-control region" in FIG. 8 and portions indicated by "A1" to "An" in the portion represented by the "control region" in FIG. 8. The portions indicated by "A1" to "An" in the portion represented by the "control region" in FIG. 8 is a total of the "non-control region" and the total of delay amount that may possibly be given to the input signal by each delay unit, which is a delay amount failing within the range of the control region. For example, a portion indicated by "A1" in FIG. 8 has a value in the control region in the delay amount to be added by "1Tap" in FIG. 8. Specifically, the value represents a delay amount specified by a boundary point between the control region and the non-control region and by "A1".

Furthermore, the total of delay amounts becomes "$T_0+\Delta t$" from "$T_0$", which is an initial cycle, by switching the external signal. Here, with the cycle difference "$\Delta t$" being equally distributed to the delay units, the delay amount to be added by the delay unit can be finely changed.

Figure 9:
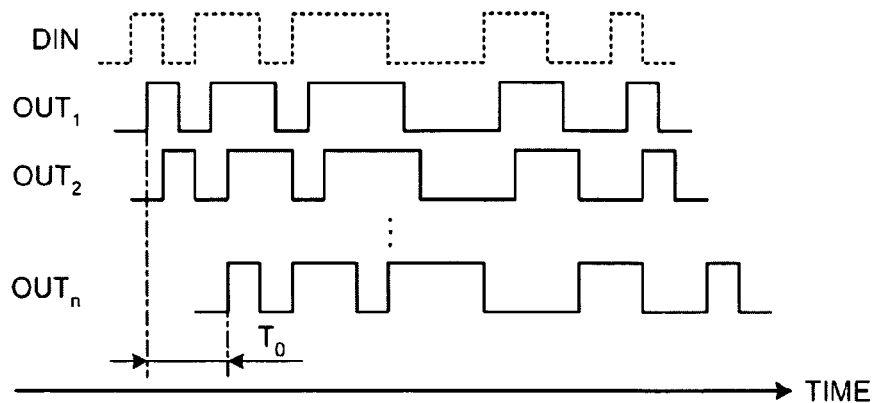
FIG. 9 is a diagram for explaining an effect of the phase controlling apparatus according to the first embodiment.

A difference in phase between the input signal ("DIN" in FIG. 9) and each of output signals ("$OUT_1$" to "$OUT_n$" in FIG. 9) is explained by using FIG. 9. As depicted in FIG. 9, the phase of the output signal output as a delay signal with the delay amount added to the input signal is shifted from the phase of DIN (input signal). Also, a difference between the phase of the input signal and the phase of the output signal output from a delay unit of the last stage ("$OUT_n$" in FIG. 9) represents a delay amount equivalent to one cycle of the external signal. Therefore, a difference between the phase of the input signal and the phase of the output signal output from the delay unit of the last stage is changed from $T_0$ to $T_0+\Delta t$ by switching the external signal. FIG. 9 is a diagram for explaining effects of the phase controlling apparatus according to the first embodiment.

Still further, with the phase difference $\Delta t$ being equally distributed to the output signals, the phase of the output signal can be finely changed.

In this manner, according to the first embodiment, by switching the external signal, the phase of the output signal can be finely controlled in a value within the control range.

Also, according to the first embodiment, the phase controlling apparatus further includes the phase-synchronizing circuit 400 that can switch to a signal different in frequency. With a reference signal as an input, the phase-synchronizing circuit 400 outputs to the voltage-controlled delay line (for DLL) 210 an external signal, which is a signal obtained by adjusting the frequency of the reference signal so that it has a phase specified by the frequency-dividing ratio of the frequency-dividing circuit 450 in the phase-synchronizing circuit 400. Here, the frequency-dividing circuit 450 accepts a control signal specified by the user using the phase controlling apparatus, and uses a frequency-dividing ratio specified by the control signal. Thus, with the frequency-dividing ratio being able to be controlled with the control signal, design flexibility can be improved on a user side.

[b] Second Embodiment

In the foregoing, in the first embodiment, a load from the phase comparator 230 to the delay unit (for DLL) 220 of the last stage is not taken into consideration. However, the present invention is not restricted to this. Specifically, a load given by the phase comparator 230 to the delay signal output from the delay unit (for DLL) 220 of the last stage may be taken info consideration.

That is, the phase comparator 230 gives a predetermined load to the delay unit (for DLL) 220 of the last stage. Also, the load given by the phase comparator 230 is not given to delay signals output from the delay units (for DLL) 220 other than the delay unit (for DLL) 220 of the last stage. Therefore, a phase difference between the delay signal output from the delay unit (for DLL) 220 of the last stage and the delay signal output from a delay unit (for DLL) 220 immediately previous to the delay unit (for DLL) 220 of the last stage is not equal to the phase difference between delay signals output from other successive two delay units (for DLL) 220.

In the first embodiment, a difference in phase difference is not particularly taken into consideration. However, the present invention is not restricted to this, and the phase differences may be equalized.

Figure 10:
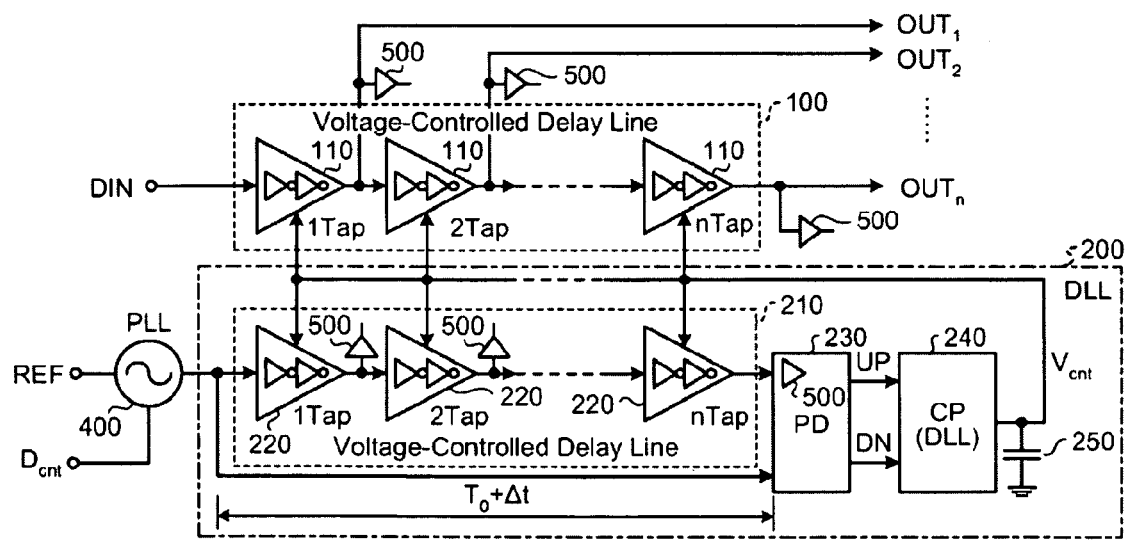
FIG. 10 is a diagram for depicting an example of the configuration of a phase controlling apparatus according to a second embodiment.

Specifically, as depicted in FIG. 10, the voltage-controlled delay line (for input signal) 100 includes elements 500 that each give a load similar to a predetermined load given by the phase comparator 230 to each delay signal output from each delay unit (for input signal) 110. Also, the voltage-controlled delay line (for DLL) 210 includes elements 500 that each give a load similar to a predetermined load given by the phase comparator 230 to each delay signal output from each delay unit (for DLL) 220. FIG. 10 is a diagram for depicting an example of the configuration of a phase controlling apparatus according to a second embodiment.

In the second embodiment, the reason for including the elements 500 that gives a predetermined load to the respective delay signals output from the respective delay units (for input signal) 110 included in the voltage-controlled delay line (for input signal) 100 is briefly explained. The voltage-controlled delay line (for input signal) 100 does not have a phase comparator, and any of the delay units (for input signal) 110 included in the voltage-controlled delay line (for input signal) 100 is subjected to a load from a phase comparator.

However, in the phase controlling apparatus according to the second embodiment, the voltage-controlled delay line (for input signal) 100 and the voltage-controlled delay line (for DLL) 210 are assumed to be identical in configuration and operate with the same control voltage. Thus, in consideration of the load by the phase comparator 230, when the voltage-controlled delay line (for DLL) 210 is provided with the elements 500, the voltage-controlled delay line (for input signal) 100 is also provided with the elements 500 to have the same configuration.

That is, in the second embodiment as described above, a load equal to the load given from the phase comparator 230 is given to all delay units included in the voltage-controlled delay line (for input signal) 100 and the voltage-controlled delay line (for DLL) 210. With this, according to the second embodiment, the phase differences of the output signals can be equalized.

[c] Third Embodiment

Meanwhile, in the first and second embodiments, an external signal is input to the voltage-controlled delay line (for DLL) 210 to generate a control voltage corresponding to a delay of one cycle of the external signal, and the generated control voltage is supplied as it is to the voltage-controlled delay line (for input signal) 100. However, this is not meant to restrict the present invention. Alternatively, the control voltage generated in the voltage-controlled delay line (for DLL) 210 may be adjusted and then supplied to the voltage-controlled delay line (for input signal) 100.

In the following, a technique of supplying the adjusted control voltage to the voltage-controlled delay line (for input signal) 100 is explained. Note that, in the following, the same explanation provided in the first and second embodiments is omitted.

General Outline of the Phase Controlling Apparatus

Figure 11:
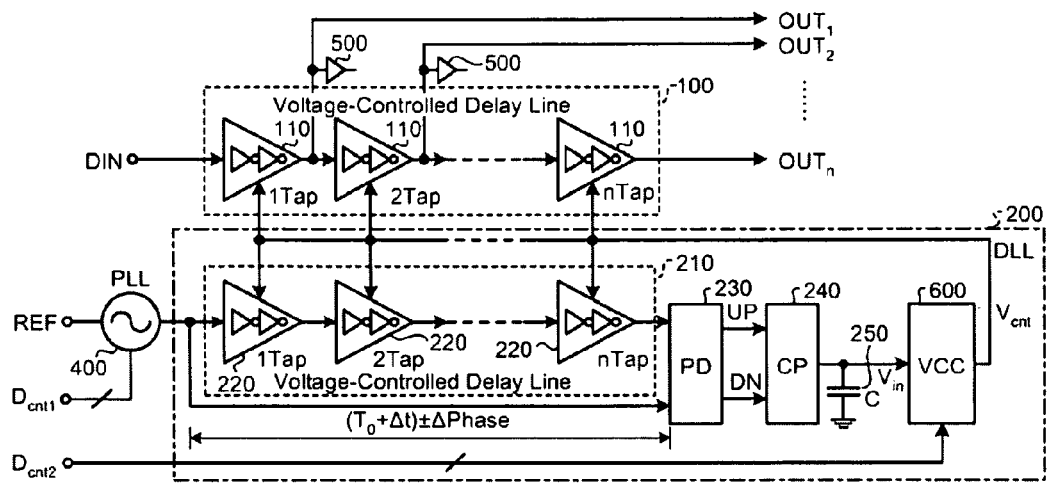
FIG. 11 is a diagram for explaining an example of the configuration of a phase controlling apparatus according to a third embodiment.

First, a general outline of the configuration of a phase controlling apparatus according to a third embodiment is briefly explained with reference to FIG. 11. FIG. 11 is a diagram for explaining an example of the configuration of the phase controlling apparatus according to the third embodiment.

Specifically, the phase controlling apparatus according to the third embodiment includes a control-voltage generation circuit that generates a control voltage and a Voltage Controlled Circuit (VCC) 600 that adjusts the voltage value of the control voltage generated by the control-voltage generation circuit. Also, in the phase controlling apparatus according to the third embodiment, the adjusted control voltage, which is a control voltage adjusted by the VCC 600, is input to each delay unit of the voltage-controlled delay line (for input signal) 100 and the voltage-controlled delay line (for DLL) 210. Note that the VCC 600 is hereinafter also referred to as a voltage adjusting circuit.

Specifically, as depicted in FIG. 11, the phase controlling apparatus according to the third embodiment includes the VCC 600 in addition to the components depicted in the example of the configuration of the phase controlling apparatus according to the first embodiment explained with reference to FIG. 2. Here, the capacitor 250 in the third embodiment is connected to the charge pump (for DLL) 240 and the VCC 600, thereby providing the control voltage to the VCC 600, as indicated by "$V_{in}$" in FIG. 11. Note that the control voltage provided by the capacitor 250 in the third embodiment is equal to the control voltage explained in the first and second embodiments.

The VCC 600 in the third embodiment is connected to the capacitor 250, and is further connected to each of the delay units (for input signal) 110 and the delay units (for DLL) 220. Also, the VCC 600 accepts the control voltage from the capacitor 250, as indicated by "Vin" in FIG. 11. Furthermore, as indicated by "Dcnt2" in FIG. 11, the VCC 600 accepts a control signal for bias controlling unit. The VCC 600 then adjusts the voltage value of the accepted control voltage. Then, as indicated by "Vcnt" in FIG. 11, the VCC 600 inputs the adjusted control voltage to each of the delay units (for input signal) 110 and the delay units (for DLL) 220.

In this manner, according to the phase controlling apparatus in the third embodiment, instead of inputting the control voltage as it is to each delay unit, the control voltage adjusted by the VCC 600 is input. Therefore, compared with the technique explained in the first and second embodiments, finer phase control can be achieved.

Example of the Configuration of the VCC

Figure 12:
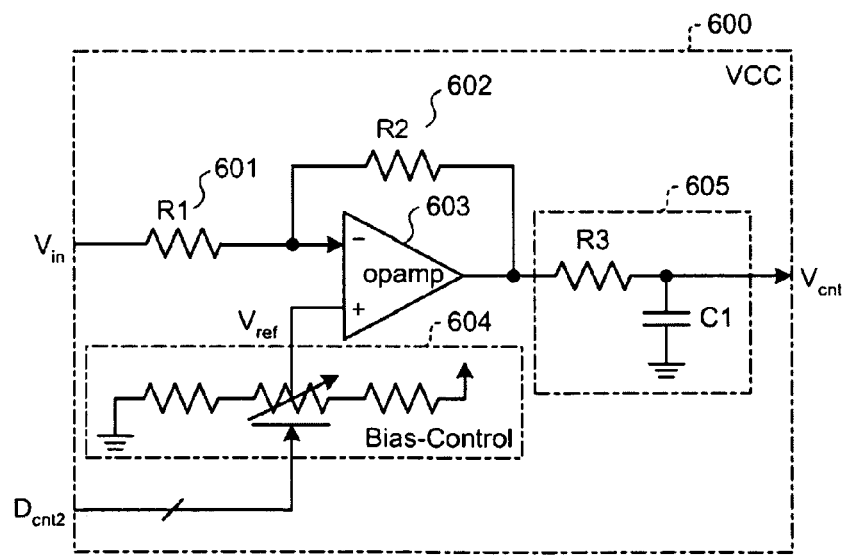
FIG. 12 is a diagram for explaining an example of the configuration of a Voltage Controlled Circuit (VCC) in the third embodiment.

Next, an example of the configuration of the VCC 600 in the third embodiment is explained with reference to FIG. 12. FIG. 12 is a diagram for explaining an example of the configuration of the VCC in the third embodiment.

Here, the VCC 600 in the third embodiment may take any configuration as long as the VCC 600 can adjust the control voltage, for example, as long as the VCC 600 can add an offset to the control voltage. In the third embodiment, a technique of achieving the VCC 600 by using an operational amplifier as an inverting amplifying circuit is explained. However, this is not meant to restrict the present invention, and an operational amplifier may be used as a non-inverting amplifying circuit.

In the example depicted in FIG. 12, the VCC 600 includes a resistor 601, a resistor 602, an operational amplifier 603, a bias controlling unit 604, and a low-pass filter unit 605. Also, as indicated by "$V_{in}$" in FIG. 12, the VCC 600 accepts a control voltage from outside the VCC 600, specifically, from the capacitor 250. Furthermore, as indicated by "$D_{cnt2}$" in FIG. 12, the VCC 600 accepts a control signal for bias controlling unit for determining a voltage to be output by the bias controlling unit 604 from the outside of the VCC 600. Still further, as indicated by "$V_{cnt}$" in FIG. 12, the VCC 600 outputs a adjusted control voltage to the outside of the VCC 600, specifically, to each of the delay units (for input signal) 110 and the delay units (for DLL) 220. The control signal for bias controlling unit is input from, for example, the user using the phase controlling apparatus or another circuit using the phase controlling apparatus.

The VCC 600 amplifies the control voltage indicated by "$V_{in}$" in FIG. 12 with reference to a voltage indicated by "$V_{ref}$" in FIG. 12. An amplification factor indicative of a ratio of amplifying "$V_{in}$" is determined by a ratio between the resistance value of the resistor 601 and the resistance value of the resistor 602. In the third embodiment, an exampled is explained assuming that the ratio between the resistance value of the resistor 601 and the resistance value of the resistor 602 is "1" unless otherwise specified.

The components included in the VCC 600 are now explained, focusing on the operational amplifier 603. The operational amplifier 603 is connected to the resistors 601 and 602, the bias controlling unit 604, and the low-pass filter unit 605. Also, the operational amplifier 603 has two inputs ("+" and "−"), and is connected at the "+" input (non-inverting input) to the bias controlling unit 604 and is connected at the "−" input (inverting input) to the capacitor 250 via the resistor 601.

Furthermore, the operational amplifier 603 includes two inputs, to which a voltage is applied each. Specifically, as indicated by "$V_{ref}$" in FIG. 12, a voltage provided from the bias controlling unit 604 is applied to the "+" input of the operational amplifier 603. Also, as indicated by "$V_{in}$" in FIG. 12, a control voltage from the capacitor 250 is applied to the "−" input of the operational amplifier 603.

Still further, the operational amplifier 603 has one output, from which a voltage is output. Specifically, as indicated by "$V_{cnt}$" in FIG. 12, a voltage is output via the low-pass filter unit 605 to the outside of the VCC 600 for input to each of the delay units (for input signal) 110 and the delay units (for DLL) 220. Mote that the voltage input to the delay units (for input signal) 110 and the delay units (for DLL) 220 from the operational amplifier 603 is an adjusted control voltage.

Still further, the operational amplifier 603 is subjected to negative feedback from one output to a "−" input. With the effect of negative feedback, the output voltage of the "+" input and the output voltage of the "−" input always coincide with each other. In other words, in the operational amplifier 603, the potential difference between the "−" input and the "+" input is "0".

The bias controlling unit 604 is connected to the operational amplifier 603 to apply a voltage to the "+" input of the operational amplifier 603. Note that the voltage applied by the bias controlling unit 604 to the operational amplifier 603 serves as a reference voltage in the operational amplifier 603. For example, the bias controlling unit 604 accepts a control signal for bias controlling unit from the user using the phase controlling apparatus according to the third embodiment, and uses the accepted control signal for bias controlling unit to determine a reference voltage.

Figure 13:
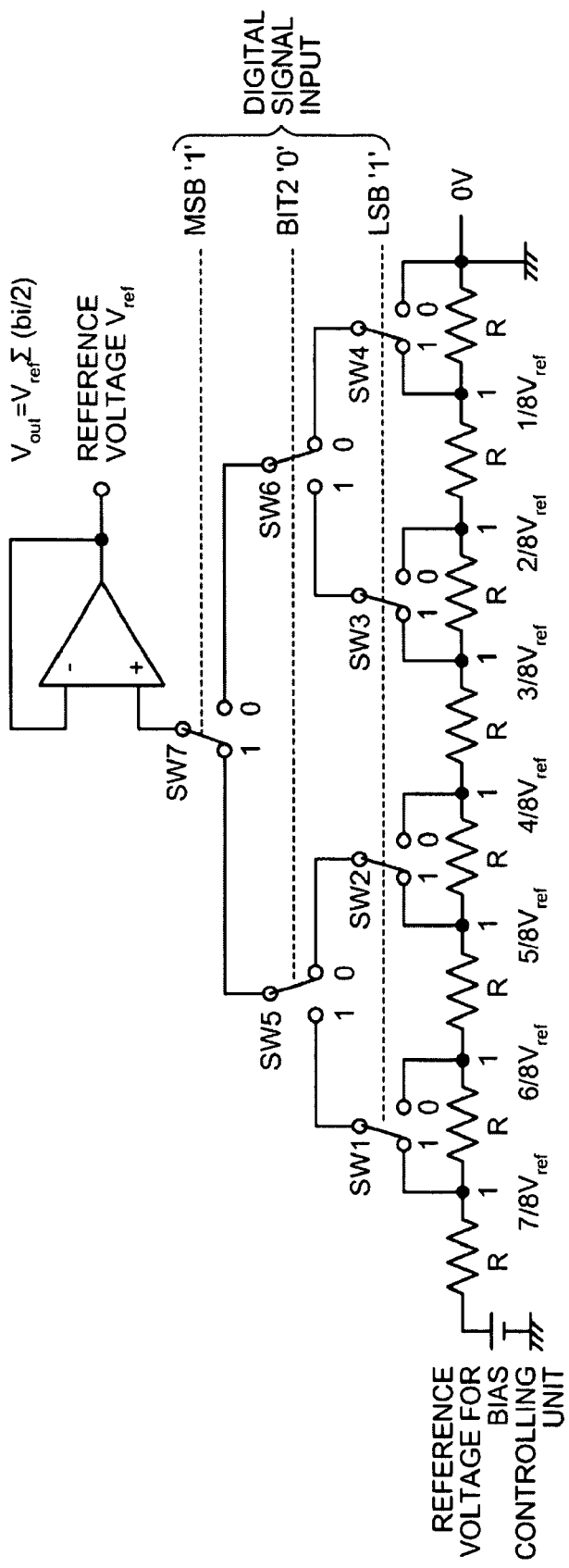
FIG. 13 is a diagram for explaining an example of the configuration of a bias controlling unit using a resistance-string-type Digital Analog Converter (DAC) in the third embodiment.

Here, the bias controlling unit 604 may have any configuration as long as it can input the reference voltage determined by the control signal for bias controlling unit to the operational amplifier 603. Although an example of a technique of using a digital-analog converter (DAC) to achieve the bias controlling unit 604 is explained in the following, this is not meant to restrict the present invention. Moreover, among techniques of applying a DAC, a technique of using a resistor string DAC to achieve the bias controlling unit 604 is explained below. However, this is not meant to restrict the present invention. For example, a resistor ladder type or weight resistor type may be used to achieve the bias controlling unit 604. In an example depicted in FIG. 13, the bias controlling unit 604 using a 3-bit control signal for bias controlling unit is used by way of example. FIG. 13 is a diagram for explaining an example of the configuration of the bias controlling unit using a resistor string DAC in the third embodiment.

With the use of the example of the configuration of the bias controlling unit 604 depicted in FIG. 13, how to determine the reference voltage to be applied by the bias controlling unit 604 to the "+" input of the operational amplifier 603 is explained. In the bias controlling unit 604, the voltage to be applied to the "+" input of the operational amplifier is controlled by an n-bit control signal. In the example depicted in FIG. 13, the bias controlling unit 604 accepts a 3-bit control signal for bias controlling unit. For example, when the control signal represents "101", the bias controlling unit 604 sets a switch of "Most Significant Bit (MSB)" at "ON (1)", sets a switch of "BIT" at "OFF (0)", and sets a switch of "Least Significant Bit (LSB)" at "ON (1)". Then, for example, the bias controlling unit 604 inputs to the operational amplifier 603 a ⅝-divided reference voltage for bias controlling unit. Note that the ⅝-divided reference voltage for bias controlling unit serves as a reference voltage for the operational amplifier 603.

Note that the operational amplifier depicted in FIG. 13 is a voltage follower inserted to break a load, and is different from the operational amplifier 603. Also, the voltage output from the operational amplifier depicted in FIG. 13 as a voltage follower servers as a reference voltage ($V_{ref}$). Furthermore, the reference voltage for bias controlling unit is a voltage, for example, determined by the manufacturer of the VCC 600.

Here, as explained above, the operational amplifier 603 is subjected to negative feedback and, when the voltage applied by the bias controlling unit 604 to the "+" input of the operational amplifier 603 is changed, the operational amplifier 603 works so as to eliminate a voltage difference. As a result, the voltage applied to the "−" input of the operational amplifier 603 is changed to a voltage of the "+" input of the operational amplifier 603.

Also, in the operational amplifier 603, even when a slightest difference occurs between the voltages applied to two inputs, the difference is reflected onto the output voltage of the operational amplifier 603. However, this output voltage is immediately fed back to the "−" input, working so as to eliminate the difference between the voltages applied to two inputs.

The low-pass filter unit 605 is connected to the operational amplifier 603, and is also connected to each of the delay units (for input signal) 110 and the delay units (for DLL) 220 outside of the VCC 600. The low-pas filter unit 605 accepts the adjusted control voltage from the operational amplifier 603, eliminates noise included in the accepted adjusted control voltage, and then inputs to each of the delay units (for input signal) 110 and the delay units (for DLL) 220.

Relation Between the Adjusted Control Voltage and Phase Difference

Figure 14:
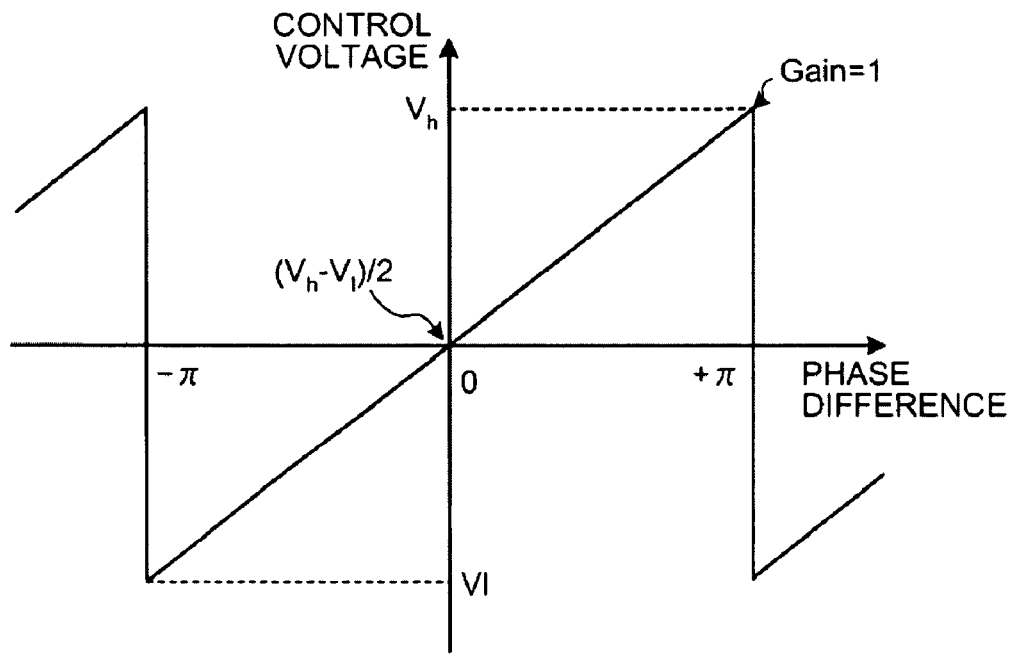
FIG. 14 is a diagram for depicting general characteristics established between a phase difference obtained as the result of comparison in a phase comparator and a control voltage.
Figure 15:
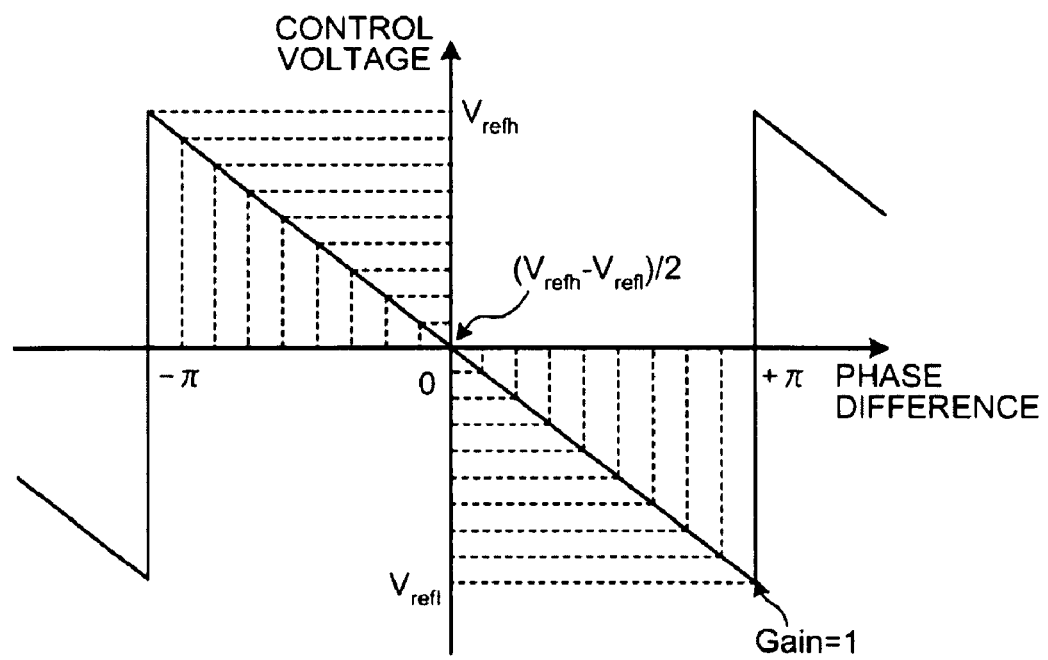
FIG. 15 is a diagram for depicting general characteristics established between the phase difference obtained as the result of comparison in the phase comparator and the control voltage.

Next, a relation between the phase difference obtained as the result of comparison in the phase comparator 230 and the control voltage is explained with reference to FIGS. 14 and 15. FIGS. 14 and 15 are diagrams for depicting general characteristics established between the phase difference obtained as the result of comparison in the phase comparator and the control voltage. In an example depicted in FIG. 14, by way of example, the control voltage output from the capacitor is "$V_n$" when the phase difference is "$\pi$".

Similarly, in normal times (when no offset is present), control is performed so that the phase difference is "0" and, in this case, the control voltage is "$(V_n+V_1)/2$". That is, with an offset being applied so that the phase difference is not "0", the phase is subtly changed by the phase controlling apparatus.

In FIGS. 14 and 15, the phase difference is changed from "$\pi$" to "$-\pi$" because a delay occurs by one cycle when the phase advances (or delays) by "$2\pi$", that is, the absolute value of the phase difference never becomes larger than "$\pi$". Similarly, "$V_{in}$", which is a control voltage input to the VCC 600, takes values in a range from "$V_1$" corresponding to a phase difference "$-\pi$" to "$V_n$" corresponding to a phase difference "$\pi$".

Here, between the phase difference as the result of comparison in the phase comparator 230 and the control voltage output from the capacitor 250 and input to each of the delay units (for input signal) 110 and the delay units (for DLL) 220, general characteristics depicted in FIGS. 14 and 15 are established. Therefore, by controlling the voltage input to the each of the delay units (for input signal) 110 and the delay units (for DLL) 220, the phase difference as the result of comparison in the phase comparator 230 is also controlled.

Note that, as depicted in FIG. 15, in the third embodiment, since the "−" input of the operational amplifier 603 is an inverting input, it is dealt at the "+" input of the operational amplifier 603 as a voltage ($V_{ref}$) obtained by inverting the control voltage depicted in FIG. 14.

Here, when the reference voltage input from the bias controlling unit 604 to "+" of the operational amplifier 603 is changed, the operational amplifier 603 works so as to eliminate a voltage difference between the "+" input and the "−" input. As a result, the voltage applied to the "−" input of the operational amplifier 603 is changed to the reference voltage of the "+" input of the operational amplifier 603. That is, when the reference voltage applied by the bias controlling unit 604 to the "+" input of the operational amplifier 603 is changed, as depicted in FIG. 15, the phase difference of the input signal is changed to a phase difference corresponding to the reference voltage.

That is, when the reference voltage of the bias controlling unit 604 is changed, the control voltage represented by the vertical axis in FIGS. 14 and 15 is changed, and the phase difference of the output signal and the phase difference of the input signal represented by the horizontal axis in FIGS. 14 and 15 are also changed. Therefore, fineness of steps of the reference voltage input from the bias controlling unit 604 corresponds to a phase resolution. As the steps of the reference voltage input from the bias controlling unit 604 are finer, the phase resolution is improved. For example, when control is performed by using an 8-bit control signal (external signal), 256 divisions are achieved. Here, by determining the number of resistance divisions from a desired phase resolution, the phase resolution can be easily set.

Figure 16:
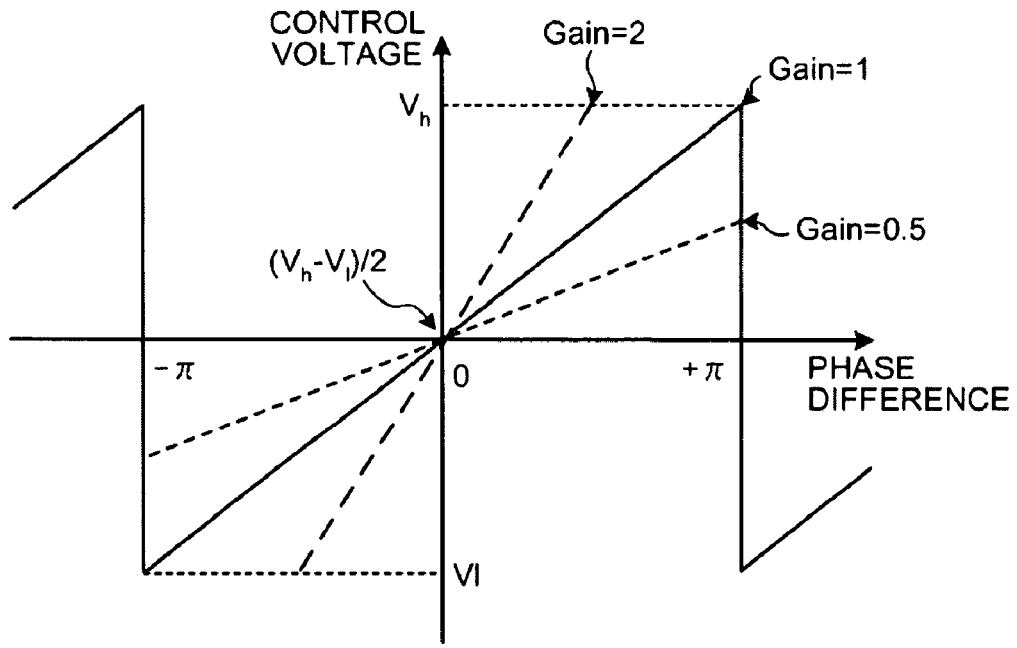
FIG. 16 is a diagram for depicting general characteristics established between the phase difference and the control voltage with a different Direct-Current (DC) gain.
Figure 17:
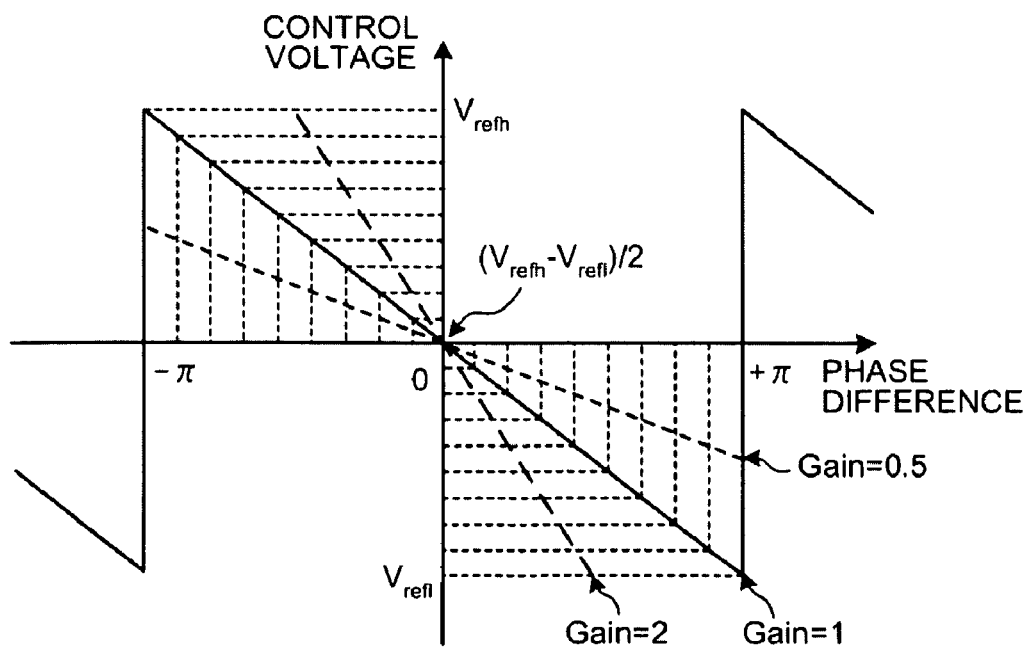
FIG. 17 is a diagram for depicting general characteristics established between the phase difference and the control voltage with a different DC gain.

As depicted in FIGS. 16 and 17, a solid line represented by "Gain=1" in FIGS. 14 and 15 indicates the case where the Direct-Current (DC) gain (hereinafter, also referred to as amplification factor) is "1", specifically, the ratio between the resistors 601 and 602 is 1. Similarly, "Gain=0.5" and "Gain=2" indicate the case where the DC gain is "0.5" and the case where the DC gain is "2", respectively. FIGS. 16 and 17 are diagrams for depicting general characteristics established between the phase difference and the control voltage with a different DC gain.

Here, the DC gain of the operational amplifier 603 is represented as "resistor 602/resistor 601", which can be changed by changing the ratio between the resistance value of the resistor 601 and the resistance value of the resistor 602. As a result, by changing the ratio between the resistance values, phase sensitivity per voltage can be adjusted. That is, when the DC gain is changed, as depicted in FIGS. 16 and 17, the relation established between the phase difference and the control voltage is changed. For example, when the DC gain is changed from "1" to "2", the phase resolution becomes finer. Compared with the case where the DC gain is "1", in the case where the DC gain is "2", the phase difference delayed with the same control voltage becomes half. That is, by increasing the DC gain, the resolution can be improved. Here, as depicted in FIGS. 16 and 17, when the DC gain is "2", compared with the case where the DC gain is "1", the maximum phase control range appears to be half.

Alternatively, a plurality of combinations of resistors with different DC gains may be provided in advance, and a switch for determining which combination is used based on an externally-accepted signal may be provided, thereby changing the DC gain by using the externally-accepted signal. That is, by controlling the DC gain, the delay amount added to the output signal may be controlled. For example, the bias controlling unit 604 accepts from the user using the phase controlling apparatus a gain control signal for specifying one of these combinations of resistors. The bias controlling unit 604 then uses the combination of resistors specified by the accepted gain control signal to output an adjusted control voltage.

As explained above, according to the third embodiment, the phase controlling apparatus includes the VCC 600, which inputs an adjusted control voltage adjusted by the VCC 600 to each of the delay units in the voltage-controlled delay line (for input signal) 100 and the voltage-controlled delay line (for DLL) 210. As a result, compared with the first and second embodiments, the phase resolution can further be improved.

Specifically, in improvement of the phase resolution, for example, the phase resolution is improved as the dividing ratio of the frequency-dividing circuit 450 is finer. Also, the phase resolution is improved as the frequency is higher. Furthermore, the phase resolution is improved as the number of delay units provided to the voltage-controlled delay line (for input signal) 100 and the voltage-controlled delay line (for DLL) 210 is increased, because the phase difference distributed to each delay unit is decreased.

Here, as the frequency is higher, the time corresponding to one cycle is decreased. As a result, the number of delay units provided in the voltage-controlled delay line (for input signal) 100 and the voltage-controlled delay line (for DLL) 210 is decreased. In other words, the technique of improving the phase resolution by increasing the frequency and the technique of increasing the number of delay units are contradictory to each other.

Furthermore, in the phase-synchronizing circuit 400, when the dividing ratio is changed, the phase relation in the circuit is changed. Thus, re-pulling is performed. Here, when re-pulling is performed, it takes some time until the phase relation is stabilized. For example, it takes time on the order of several tens of microseconds. Still further, the technique of finely setting the dividing ratio at the frequency-dividing circuit 450 and the technique of setting a high frequency may possibly restrict the circuit design.

Still further, phase control with accuracy higher than the order of several picoseconds will possibly be required in the future. For example, in optical transmission apparatuses, the transfer rate has been developed to 40 G, 100 G, or the like. In the case of 100 G, the time corresponding to one cycle is 10 picoseconds. As a result, in the case of signal transmission using phase information represented by 100 G signals, phase adjustment of 5 picoseconds, 2.5 picoseconds, 1.25 picoseconds or the like will possibly be required.

According to the third embodiment, the phase is controlled by using the adjusted control voltage obtained by adjusting the control voltage with the use of the VCC 600. Therefore, the phase resolution can be improved compared with the first and second embodiments. Also, according to the third embodiment, the phase can be controlled irrespectively of the dividing ratio or the number of delay units. Furthermore, it is possible to eliminate the time required due to re-pulling until the operation is stabilized.

A further effect according to the third embodiment is explained. When the VCC 600 is not used, the phase resolution is represented by "$\Delta\phi_2=\Delta t/nTap$", where $\Delta\phi_1$ is a phase difference added to each delay unit when the VCC 600 is not used. "$\Delta\phi_1$" is obtained by dividing a phase difference "$\Delta t$" generated by the phase-synchronizing circuit 400 by the number of delay units "nTap".

By contrast, when the VCC 600 is used, "$\Delta\phi_2=T_1/2^{nBit}/nTap$" holds, where "$T_1$" is an output signal cycle of the phase-synchronizing circuit 400 and corresponds to "$2\pi$" in FIGS. 16 and 17, and "$\Delta\phi_2$" is a phase difference added to each delay unit when the VCC 600 is used. "$\Delta\phi_2$" is obtained by dividing "$T_1$" by the number of steps where the control voltage is adjusted by the VCC 600. In the example explained in the third embodiment, for example, when the reference voltage is divided by the bias controlling unit 604 into "256", "$\Delta\phi_2$" is obtained by dividing "$T_1$" into "256".

Figures 18, 19:
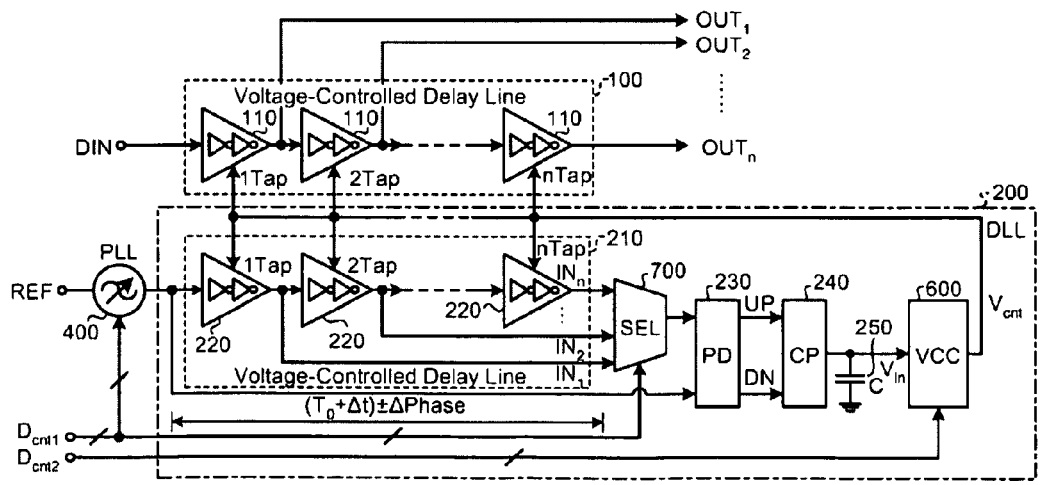
FIG. 18 is a table for explaining an effect of the third embodiment.
FIG. 19 is a diagram for explaining an example of the configuration of a phase controlling apparatus according to a fourth embodiment.

Next, a further effect of the third embodiment is explained with reference to FIG. 18 with specific values. FIG. 18 is a table for explaining an effect of the third embodiment.

With reference to FIG. 18, an example is explained in which a REF signal for PLL (reference signal) is 20 megahertz, the dividing ratio is 2 to n (n=2 to 7), and the number of delay units provided to the voltage-controlled delay line is 10. In this example, it is assumed in the VCC 600 that the fineness of steps of the voltage value is 8 bits (256 division) or 10 bits (1024 division), and the dividing ratio is 32 as a reference.

As indicated by "first phase control" in FIG. 18, when the dividing ratio is "16" and the VCC 600 is not used, the phase resolution is "3125.0 picoseconds". By contrast, as indicated by "second phase control" in FIG. 18, when the dividing ratio is "16" and the VCC 600 for "8-bit control" is used, the phase resolution is "1.22 picoseconds" obtained by dividing "3125.0 picoseconds" by "256".

In this manner, according to the third embodiment, the phase resolution can be improved by compensating for restrictions for obtaining a fine phase resolution. That is, according to the third embodiment, it is possible to compensate restrictions such that the dividing ratio has to be finely set and several delay units have to be provided on the voltage-controlled delay line.

Also, according to the third embodiment, the phase difference can be independently controlled at the VCC 600 without resetting the dividing ratio, for example, even with the dividing ratio being fixed. Also, the requirement of the time due to re-pulling until the operation is stabilized can be mitigated.

[d] Fourth Embodiment

In the third embodiment, the technique is explained in which the phase comparator 230 compares the delay signal delayed by every delay unit (for DLL) 220 and the external signal output from the phase-synchronizing circuit 400 to obtain a phase difference. However, this is not meant to restrict the present invention. For example, the delay signal delayed by only part of the delay units (for DLL) 220 provided to the voltage-controlled delay line (for DLL) 210 and the external signal may be compared to obtain a phase difference.

For example, when the dividing ratio is significantly changed at the phase-synchronizing circuit 400, the cycle of the external signal output from the phase-synchronizing circuit 400 is significantly changed. As a result, for example, when the delay signals delayed by the respective delay units (for DLL) 220 are uniformly used irrespectively of the dividing ratio for comparison to obtain a phase difference, the delay may deviate from the "control region" explained with reference to FIG. 8.

For example, even if the cycle of the external signal is increased to cause each delay unit (for DLL) 220 to add its maximum addable delay amount, a delay amount corresponding to one cycle of the external signal may not be added in the voltage-controlled delay line (for DLL) 210. Also, for example, even if the cycle of the external signal is decreased to cause each delay unit (for DLL) 220 to add its minimum addable delay amount, a delay amount larger than the delay amount corresponding to one cycle of the external signal may be added in the voltage-controlled delay line (for DLL) 210.

To get around this, in a fourth embodiment, a phase controlling apparatus achieving fine phase control without deviating the "control region" even if the cycle of the external signal output from the phase-synchronizing circuit 400 is significantly changed is explained.

As depicted in FIG. 19, the phase controlling apparatus according to the fourth embodiment further includes a selector circuit 700 (hereinafter, also referred to as a delay-signal output unit). Also, the selector circuit 700 accepts a delay signal for each delay unit provided to the voltage-controlled delay line (for DLL) 210, and outputs only a predetermined delay signal among the accepted delay signals. FIG. 19 is a diagram for explaining an example of the configuration of the phase controlling apparatus according to the fourth embodiment. For convenience, the selector circuit 700 is indicated by "SEL" in FIG. 19.

In the phase controlling apparatus according to the fourth embodiment, each of the delay units (for DLL) 220 provided to the voltage-controlled delay line (for DLL) 210 is connected to the selector circuit 700. In the voltage-controlled delay line (for DLL) 210, when an external signal is accepted, each of the delay units (for DLL) 220 acids the delay amount to the phase of the delay signal in the order in which the delay amount is first added to the delay unit at the first stage among the delay units (for DLL) 220 coupled in series. Also, each of the delay units (for DLL) 220 sends its delay signal for each delay unit to the selector circuit 700. Specifically, the delay units (for DLL) 220 in the voltage-controlled delay line (for DLL) 210 are connected in series, each adding the delay amount and outputting its delay signal for each of the delay units to the selector circuit 700.

For example, in the voltage-controlled delay line (for DLL) 210, a first delay unit adds a delay amount to an external signal accepted from the phase-synchronizing circuit 400, and then sends the resultant signal to a second delay unit and the selector circuit 700. Then, the second delay unit adds the delay amount to the delay signal accepted from the first delay unit, and then sends the resultant signal to a third delay unit and the selector circuit 700.

The selector circuit 700 is connected to each of the delay units (for DLL) 220, and is also connected to the phase comparator 230. The selector circuit 700 accepts a delay signal from each of the delay units (for DLL) 220, and outputs only a predetermined delay signal among the accepted delay signals to the phase comparator 230. Specifically, as indicated by "$D_{cnt1}$" in FIG. 19, the selector circuit 700 accepts a control signal for outputting a predetermined delay signal among the delay signals accepted from the delay units (for DLL) 220. The selector circuit 700 then outputs only the delay signal specified by the accepted control signal to the phase comparator 230. In the example of FIG. 18, the case is depicted in which the selector circuit 700 accepts a control signal identical to the control signal also input to the phase-synchronizing circuit 400.

The selector circuit 700 also includes, for example, simple switches with a small propagation delay time. Each switch is created by using, for example, a transfer gate. In the selector circuit 700, for example, "ON" and "OFF" of the switches is controlled by a control signal. In other words, open and close of each switch is controlled. Also, in the selector circuit 700, each of combinations of "ON" and "OFF" of the switches corresponds to a delay signal accepted from each of the delay units (for DLL) 220, and only one delay signal is output. The selector circuit 700 can have any circuit configuration as long as the selector circuit 700 can output a predetermined delay signal among the delay signals, and the present invention is not meant to be restricted to the circuit structure using switches.

The selector circuit 700 outputs a delay signal determined by the cycle length of an external signal. For example, the selector circuit 700 stores in advance the number of delay units (for DLL) 220 corresponding to the dividing ratio of the phase-synchronizing circuit 400. For example, the number of delay units (for DLL) 220 corresponding to the dividing ratio is set and stored by the manufacture of the phase controlling apparatus. Note that, as explained above, the dividing ratio has a value for determining the cycle length of the external signal. The selector circuit 700 then outputs a delay signal to which a delay amount is added by the delay units (for DLL) 220 the number of which corresponds to the dividing ratio selected by the phase-synchronizing circuit 400.

The association between the dividing ratio and the number of delay units (for DLL) 220 is now further explained. Here, an exemplary case is explained in which when the dividing ratio is "32", the "control region" is applied when the number of delay units (for DLL) 220 is 4. For example, when the dividing ratio is "16", the cycle of the external signal output from the phase-synchronizing circuit 400 is doubled compared with the cycle of the external signal output when the dividing ratio is "32". Therefore, when the dividing ratio is "16", the number of delay units (for DLL) 220 is 8, which is obtained by doubling the number of delay units (for DLL) 220 required when the dividing ratio is "32". In this case, the selector circuit 700 stores the number of delay units (for DLL) 200 of "8" in association with the dividing ratio of "16".

Also, in the example depicted in FIG. 18, the selector circuit 700 accepts a control signal identical to the control signal for determining the dividing ratio in the frequency-dividing circuit 450 of the phase-synchronizing circuit 400. In this case, the selector circuit 700 stores, for each control signal for determining the dividing ratio, the number of delay units (for DLL) 220 corresponding to the dividing ratio determined by the control signal.

The phase comparator 230 then compares the delay signal output from the selector circuit 700 and the external signal to which no delay amount is added in the voltage-controlled delay line (for DLL) 210 to obtain a phase difference. Specifically, the phase comparator 230 compares the external signal accepted from the phase-synchronizing circuit 400 and the delay signal accepted from the selector circuit 700 to obtain a phase difference.

In this manner, according to the fourth embodiment, the selector circuit 700 is further provided to accept a delay signal for each of the delay units (for DLL) 220 provided to the voltage-controlled delay line (for DLL) 210 and output only the predetermined delay signal among the accepted delay signals. Then, the phase comparator 230 compares the delay signal output by the selector circuit 700 and the external signal to which no delay amount is added in the voltage-controlled delay line (for DLL) 210 to obtain a phase difference. As a result, in the fourth embodiment, the delay signal output from the selector circuit 700 is selected according to fluctuations of the external signal, thereby achieving fine phase control without deviating from the "control region".

A further effect of the fourth embodiment is explained with reference to FIGS. 20 and 21. FIGS. 20 and 21 are tables for explaining an effect of the fourth embodiment. In the following explanation with reference to FIGS. 20 and 21, items similar to those in FIG. 18 are not explained.

In FIGS. 20 and 21, Δt and other values are exemplarily depicted with reference to a dividing ratio of "32" and the number of delay units (for DLL) 220 of "4". Also, in the example depicted in FIG. 20, the number of delay units (for DLL) 220 is fixed to "4". Furthermore, in the example depicted in FIG. 21, the number of delay units (for DLL) 220 is set at 1 to 32 so as to be inversely proportional to the dividing ratio. In the following, for convenience of explanation, it is assumed that the delay amount added by, for example, four delay units (for DLL) 220 is "100 picoseconds to 2000 picoseconds".

As depicted in FIG. 20, when the dividing ratio is "4", the delay amount corresponding to one cycle of the external signal output from the phase-synchronizing circuit 400 is "12500.0 picoseconds". When the VCC 600 is not used, "12500.0 picoseconds" is added by four delay units (for DLL) 220, exceeding the maximum delay amount "2000 picoseconds" that can be added by four delay units (for DLL) 220.

By contrast, as depicted in FIG. 21, the number of delay units (for DLL) 220 is changed according to the cycle length of the external signal output from the phase-synchronizing circuit 400, thereby preventing deviation from the "control region". In the example depicted in FIG. 21, it is set that, as the dividing ratio is increased, the cycle length of the external signal is shortened and the number of delay units (for DLL) 220 is decreased. For example, when the dividing ratio is "4", the number of delay units (for DLL) 220 is "32", and the delay amount added by 32 delay units (for DLL) 220 is "12500.0 picoseconds". Here, when the delay amount added by four delay units (for DLL) 220 is "1000 picoseconds to 2000 picoseconds", with 32 delay units (for DLL) 220, the delay amount added is "8000 picoseconds to 16000 picoseconds". That is, the delay amount added by each of the delay units (for DLL) 220 is "12500.0 picoseconds", which does not exceed the maximum value of "16000 picoseconds", thereby achieving fine phase control without deviating from the control region.

In this manner, according to the fourth embodiment, switching is made as to the number of delay units (for DLL) 220 for use among the delay units (for DLL) 220 provided to the voltage-controlled delay line (for DLL) 210. As a result, according to the fourth embodiment, fine phase control can be achieved without deviating from the control region.

Also, as depicted in FIG. 21, the number of steps of delay units (for DLL) 220 is increased or decreased in inverse proportion to the dividing ratio. Therefore, when the dividing ratio is small, the number of delay units (for DLL) 220 is increased. Therefore, even if the cycle of the external signal is long, a fine phase resolution can be achieved.

[e] Other Embodiments

In the foregoing, the first to fourth embodiments of the present invention have been explained. However, the present invention is not meant to be restricted to these embodiments explained above, and can be implemented in other embodiments. In the following, such other embodiments are explained.

For example, in the phase controlling apparatus according to the first embodiment, the technique of using the clock generator 300 when an external signal is input to the DLL circuit 200 is explained. Specifically, the phase controlling apparatus according to the first embodiment includes the clock generator 300. However, the present invention is not meant to be restricted to this. For example, the phase controlling apparatus according to the third embodiment may accept an external signal from outside of the phase controlling apparatus according to the third embodiment and may perform a process by using the accepted external signal.

Monitoring Circuit

Also, for example, the phase controlling apparatus may further include a standard-voltage storage unit that stores in advance a standard voltage to be input to each of the delay units in the second delay line and a monitoring unit that monitors the control voltage and the adjusted control voltage. For example, the standard-voltage storage unit stores a standard voltage set by a user in advance.

That is, the monitoring unit monitors the control voltage and the adjusted control voltage input to the voltage-controlled delay line (for input signal) 100 and the voltage-controlled delay line (for DLL) 210, monitoring whether the monitored voltage is equal to the standard voltage set in advance. When the voltage is not equal to the standard voltage, the monitoring unit may feed back the monitoring result to the phase-synchronizing circuit 400 and the VCC 600 so that the control voltage and the adjusted controlled voltage are equal to the standard voltage.

Figure 22:
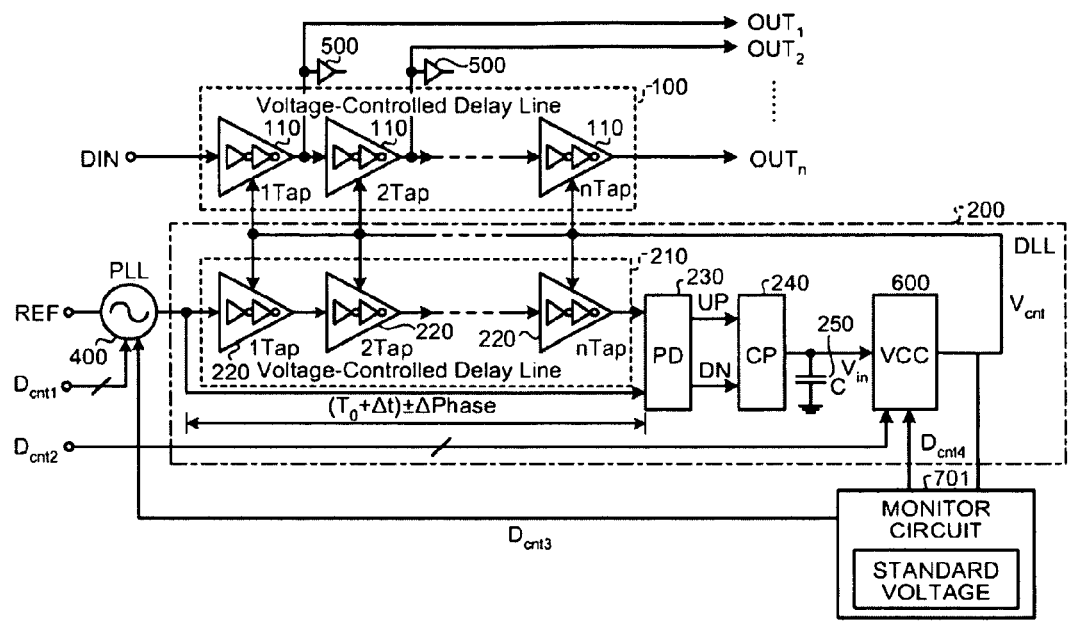
FIG. 22 is a diagram for explaining an example of the configuration of a phase controlling apparatus with a monitor circuit.

For example, as depicted in FIG. 22, a monitoring unit 701 is connected to the VCC 600. Also, the monitoring unit 701 includes the standard-voltage storage unit that stores a standard voltage in advance. FIG. 22 is a diagram for explaining an example of the configuration of a phase controlling apparatus with a monitor circuit. The monitoring unit 701 monitors the adjusted control voltage from the VCC 600, and monitors, with reference to the standard voltage stored in the standard-voltage storage unit, whether the adjusted control voltage is equal to the standard voltage. When obtaining the monitoring result that the adjusted control voltage is not equal to the standard voltage, as indicated by "Dcnt3" and "Dcnt4" in FIG. 22, the monitoring unit 701 transmits to the phase-synchronizing circuit 400 and the VCC 600 a control signal for making the value of the adjusted control voltage equal to the standard voltage.

As indicated by "$D_{cnt3}$" in FIG. 22, when accepting a control signal from the monitor circuit, the phase-synchronizing circuit 400 changes the dividing ratio determined by the accepted control signal. Also, as indicated by "$D_{cnt4}$" in FIG. 22, when accepting a control signal from the monitor circuit, the VCC 600 uses the reference voltage determined by the accepted control signal to adjust the control voltage.

In the example depicted in FIG. 22, the case is explained in which the monitoring unit 701 monitors adjustment control. However, this is not meant to restrict the present invention. For example, the control voltage may be monitored from the capacitor 250. Also, the monitoring unit 701 may monitor the control voltage and the adjusted control voltage.

Frequency-Dividing Circuit

In the first embodiment, in the phase-synchronizing circuit 400, the frequency-dividing circuit 450 is used to switch the external signal. However, the present invention is not restricted to this. For example, the delay amount to be added by the phase-synchronizing circuit to the input signal may be fixed.

System Configuration

The process procedure, the control procedure, specific names, and information including various data and parameters in the specification and the drawings (FIGS. 1 to 6 and 9) can be arbitrarily changed unless otherwise specified.

According to the disclosed phase controlling apparatus, the phase of the output signal can be finely controlled.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:
1. A phase controlling apparatus comprising:
  a first delay line with delay units adding a delay amount to a phase of a signal, the first delay line over which, when an input of an input signal is accepted, a delay amount is added by each of the delay units to a phase of the input signal and a delay signal for each input signal of the delay units is output; and
  a DLL circuit including
    a second delay line with delay units, the second delay line over which, when an input of an external signal that can be externally switched to a signal different in frequency, a delay amount is added by each of the delay units to a phase of the external signal the external signal being a different signal from the input signal;
    a phase comparator that compares a phase of a delay signal delayed by all of the delay units of the second delay line and a phase of the external signal to which no delay amount is added on the second delay line to output a phase difference; and
    a delay-unit controlling circuit that inputs, to each of the delay units of the first delay line and the delay units of the second delay line, a control voltage value that is a value for synchronizing the delay signal to be compared by the phase comparator with the external signal and is generated from the phase difference output from the phase comparator.

2. The phase controlling apparatus according to claim 1, further comprising a PLL circuit capable of switching to a signal different in frequency, wherein
the PLL circuit outputs an external signal, which is a signal obtained by adjusting a phase of a reference signal as an input to a phase specified by a frequency-dividing ratio of a frequency-dividing circuit in the PLL circuit.

3. The phase controlling apparatus according to claim 2, wherein
the frequency-dividing circuit accepts a control signal specified by a user using the phase controlling apparatus and uses a frequency-dividing ratio specified by the control signal.

4. The phase controlling apparatus according to claim 3, wherein
the delay-unit controlling circuit includes a control-voltage generating circuit that generates a control voltage and a voltage adjusting circuit that adjusts the control voltage generated by the control-voltage generating circuit, and inputs an adjusted control voltage obtained by the voltage adjusting circuit adjusting the control voltage to each of the delay units of the first delay line and the second delay line.

5. The phase controlling apparatus according to claim 4, wherein
the control-voltage generating circuit generates a control voltage having a fixed value, and
the voltage adjusting circuit adjusts the control voltage having the fixed value generated by the control-voltage generating circuit.

6. The phase controlling apparatus according to claim 5, wherein
the delay units of the second delay line are connected in series, and each add a delay amount and output a delay signal for each delay unit,
the phase controlling apparatus further comprises a delay-signal output unit that accepts a delay signal for each delay unit provided to the second delay line and outputs only a delay signal determined by a cycle length of the external signal among the accepted delay signals, and
the phase comparator compares a phase of the delay signal output from the delay-signal output unit and a phase of the external signal to which no delay amount is added on the second delay line to obtain a phase difference.

7. The phase controlling apparatus according to claim 6, wherein
the voltage adjusting circuit includes a bias controlling unit and an operation amplifier and, with the control voltage and a reference voltage value controlled by the bias controlling unit being taken as a control voltage of the operation amplifier, outputs from the operation amplifier an adjusted control voltage obtained by adjusting the control voltage at a voltage specified by the reference voltage value, and
the operation amplifier outputs the adjusted control voltage by using a DC gain specified by a gain control signal specified by a user using the phase controlling apparatus.

8. The phase controlling apparatus according to claim 7, further comprising:
a storage unit that stores in advance a standard voltage to be input to each of the delay units of the second delay line; and
a monitoring unit that monitors either one or both of the control voltage and the adjusted control voltage so that either one or both of the control voltage and the adjusted control voltage are equal to the standard voltage stored in the storage unit in advance and, when either one or both of the control voltage and the adjusted control voltage are different from the standard voltage, feeds back the monitoring result to either one or both of the control-voltage generating circuit and the voltage adjusting circuit, and
either one or both of the control-voltage generating circuit and the voltage adjusting circuit uses the fed-back monitoring result from the monitoring unit to generate or adjust the control voltage.

9. The phase controlling apparatus according to claim 1, wherein
the phase comparator gives a predetermined load to a delay signal output from a delay unit of a last stage of the second delay line,
the first delay line has elements for delay signals output from the respective delay units, the elements providing a load similar to a predetermined load provided by the phase comparator to the delay signals, and
the second delay line has elements for delay signals output from delay units other than the delay unit of the last stage, the elements providing the load similar to the predetermined load provided by the phase comparator to the delay signals.

10. A printed board on which a phase controlling apparatus is mounted, the phase controlling apparatus comprising:
a first delay line with delay units adding a delay amount to a phase of a signal, the first delay line over which, when an input of an input signal is accepted, a delay amount is added by each of the delay units to a phase of the input signal and a delay signal for each input signal of the delay units is output; and
a DLL circuit including
a second delay line with delay units, the second delay line over which, when an input of an external signal that can be externally switched to a signal different in frequency, a delay amount is added by each of the delay units to a phase of the external signal the external signal being a different signal from the input signal;
a phase comparator that compares a phase of a delay signal delayed by all of the delay units of the second delay line and a phase of the external signal to which no delay amount is added on the second delay line to output a phase difference; and
a delay-unit controlling circuit that inputs, to each of the delay units of the first delay line and the delay units of the second delay line, a control voltage value that is a value for synchronizing the delay signal to be compared by the phase comparator with the external signal and is generated from the phase difference output from the phase comparator.

11. A phase controlling method comprising:
in response to an input signal, adding a delay amount to a phase of the input signal with first delay units and outputting a delay signal for each input signal of the first delay units;
in a DLL circuit, in response to an external signal that is a different signal from the input signal and can be externally switched to a signal different in frequency, adding a delay amount to a phase of the external signal with second delay units;
in the DLL circuit, comparing a phase of a delay signal delayed by all of the delay units at the adding with second delay units, with a phase of the external signal to which no delay amount is added; and
in the DLL circuit, inputting, to each of the first and second delay units, a control voltage value that is a value for synchronizing with the external signal the delay signal to be compared at the comparing and is generated from a phase difference obtained by the comparing.

* * * * *